United States Patent
Lappen et al.

(10) Patent No.: US 7,032,614 B2
(45) Date of Patent: Apr. 25, 2006

(54) FACILITIES CONNECTION BOX FOR PRE-FACILITATION OF WAFER FABRICATION EQUIPMENT

(75) Inventors: Alan Rick Lappen, San Martin, CA (US); Ronald V. Schauer, Gilroy, CA (US)

(73) Assignee: Applied Materials, Inc., Santa Clara, CA (US)

( * ) Notice: Subject to any disclaimer, the term of this patent is extended or adjusted under 35 U.S.C. 154(b) by 410 days.

(21) Appl. No.: 10/335,968

(22) Filed: Jan. 2, 2003

(65) Prior Publication Data

US 2003/0173490 A1    Sep. 18, 2003

Related U.S. Application Data

(63) Continuation-in-part of application No. 10/099,900, filed on Mar. 14, 2002, now abandoned, and a continuation-in-part of application No. 09/906,395, filed on Jul. 15, 2001, and a continuation-in-part of application No. 09/706,435, filed on Nov. 3, 2000.

(51) Int. Cl.
*F16K 1/00* (2006.01)

(52) U.S. Cl. .................. 137/312; 137/597; 137/884; 204/298.25; 204/298.35; 414/935

(58) Field of Classification Search ........... 118/718, 118/719; 204/298.25, 298.35; 137/312, 597, 137/884; 134/1.1, 1.2, 1.3; 414/935

See application file for complete search history.

(56) References Cited

U.S. PATENT DOCUMENTS

| | | |
|---|---|---|
| 444,533 A | 1/1891 | Holden |
| 1,742,886 A | 1/1930 | Warman |
| 2,197,598 A | 4/1940 | Way |
| 2,268,263 A | 12/1941 | Newell et al. |
| 2,814,995 A | 12/1957 | Sullivan, Jr. et al. |
| 3,036,375 A | 5/1962 | Schlosser, Jr. et al. |
| 3,096,781 A | 7/1963 | Roidt |
| 3,676,568 A | 7/1972 | Fork |
| 3,713,620 A | 1/1973 | Tkach |
| 3,721,051 A | 3/1973 | Fork |
| 3,843,281 A | 10/1974 | Meyla et al. |
| 3,848,379 A | 11/1974 | Hazen |
| 3,851,674 A | 12/1974 | Fork |
| 3,862,350 A | 1/1975 | Milosavich |
| 3,902,615 A | 9/1975 | Levy et al. |
| 3,903,666 A | 9/1975 | Fork |
| 3,904,524 A | 9/1975 | Pelton et al. |

(Continued)

FOREIGN PATENT DOCUMENTS

| | | |
|---|---|---|
| EP | 0 094780 | 11/1983 |
| EP | 0 497 281 A2 | 1/1992 |
| EP | 1 107 288 A2 | 6/2001 |
| JP | 08323036 A | 1/1996 |
| WO | WO 99/03133 | 1/1999 |
| WO | WO 00/54930 | 9/2000 |

*Primary Examiner*—Kevin Lee
(74) *Attorney, Agent, or Firm*—Dugan & Dugan PC

(57) ABSTRACT

A facilities connection box is provided to accommodate pre-plumbing of facilities lines required in connection with an installation of semiconductor device manufacturing equipment. The facilities connection box accommodates termination of double-containment facilities lines that are adapted to carry hazardous materials required for operation of the semiconductor device manufacturing equipment. Each double-containment facilities line is terminated in an isolation compartment of the facilities connection box. Each isolation compartment has an entry port adapted to couple to an incoming double-containment line and an exit port adapted to permit egress from the isolation compartment of a respective outgoing line.

25 Claims, 31 Drawing Sheets

U.S. PATENT DOCUMENTS

| | | | |
|---|---|---|---|
| 3,913,964 A | 10/1975 | Lukeman | |
| 3,932,696 A | 1/1976 | Fork et al. | |
| 4,012,873 A | 3/1977 | Lindner | |
| 4,024,684 A | 5/1977 | Holmgren | |
| 4,084,865 A | 4/1978 | Joyce | |
| 4,085,987 A | 4/1978 | Vartdal | |
| 4,178,469 A | 12/1979 | Fork | |
| 4,194,332 A | 3/1980 | Fork | |
| 4,209,660 A | 6/1980 | Flachbarth et al. | |
| 4,243,197 A | 1/1981 | Wright | |
| 4,289,921 A | 9/1981 | Gartner et al. | |
| 4,323,723 A | 4/1982 | Fork et al. | |
| 4,351,613 A | 9/1982 | Hope et al. | |
| 4,480,656 A | 11/1984 | Johnson | |
| 4,505,449 A | 3/1985 | Turner et al. | |
| 4,510,980 A | 4/1985 | Bartlett et al. | |
| 4,523,416 A | 6/1985 | Payne et al. | |
| 4,558,544 A | 12/1985 | Albrecht et al. | |
| 4,572,474 A | 2/1986 | Derlich | |
| 4,603,523 A | 8/1986 | Albrecht et al. | |
| 4,643,303 A | 2/1987 | Arp et al. | |
| 4,685,585 A | 8/1987 | Robbins et al. | |
| 4,696,496 A | 9/1987 | de Guelis et al. | |
| 4,721,476 A | 1/1988 | Zeliff et al. | |
| 4,722,298 A | 2/1988 | Rubin et al. | |
| 4,728,750 A | 3/1988 | Teslovich | |
| 4,770,121 A | 9/1988 | Ebata et al. | |
| 4,835,924 A | 6/1989 | Blacklin et al. | |
| 4,850,162 A | 7/1989 | Albrecht | |
| 4,852,516 A | 8/1989 | Rubin et al. | |
| RE33,220 E | 5/1990 | Collier | |
| 5,008,491 A | 4/1991 | Bowman | |
| 5,076,205 A * | 12/1991 | Vowles et al. | 118/719 |
| 5,083,364 A | 1/1992 | Olbrich et al. | |
| 5,098,221 A | 3/1992 | Osborne | |
| 5,107,775 A | 4/1992 | Langlais et al. | |
| 5,123,435 A | 6/1992 | Blacklin et al. | |
| 5,152,635 A | 10/1992 | Ziu | |
| 5,205,592 A | 4/1993 | Ziu | |
| 5,246,044 A | 9/1993 | Robertson et al. | |
| 5,280,132 A | 1/1994 | Clarey et al. | |
| 5,285,923 A | 2/1994 | Brandon, Jr. | |
| 5,297,896 A | 3/1994 | Webb | |
| 5,323,903 A | 6/1994 | Bush et al. | |
| 5,333,825 A | 8/1994 | Christensen | |
| 5,398,620 A | 3/1995 | Rouch | |
| 5,427,474 A | 6/1995 | Silvers | |
| 5,437,303 A | 8/1995 | Johnson et al. | |
| 5,499,473 A | 3/1996 | Ramberg | |
| 5,505,295 A | 4/1996 | Whittington | |
| 5,555,845 A | 9/1996 | Flynn | |
| 5,681,063 A | 10/1997 | Bressner | |
| 5,713,550 A | 2/1998 | Schwarzli | |
| 5,733,024 A | 3/1998 | Slocum et al. | |
| 5,738,436 A | 4/1998 | Cummings et al. | |
| 5,836,130 A | 11/1998 | Unruh et al. | |
| 5,881,760 A | 3/1999 | Del Zotto | |
| 6,028,267 A | 2/2000 | Byrne | |
| 6,061,983 A | 5/2000 | McCleskey | |
| 6,066,807 A | 5/2000 | Gudgeon | |
| 6,133,981 A | 10/2000 | Semba | |
| 6,173,856 B1 | 1/2001 | Bierce et al. | |
| 6,183,021 B1 | 2/2001 | Walsh et al. | |
| 6,187,103 B1 | 2/2001 | Huang et al. | |
| 6,216,991 B1 | 4/2001 | Okamoto | |
| 6,230,735 B1 | 5/2001 | Bravo | |
| 6,258,332 B1 | 7/2001 | Johnson et al. | |
| 6,305,407 B1 | 10/2001 | Selby | |
| 6,308,477 B1 | 10/2001 | Santamaria | |
| 6,312,525 B1 * | 11/2001 | Bright et al. | 118/719 |
| 6,324,800 B1 | 12/2001 | Valentz et al. | |
| 6,328,345 B1 | 12/2001 | Moore et al. | |
| 6,332,554 B1 | 12/2001 | McCarthy | |
| 6,575,904 B1 | 6/2003 | Nagai et al. | |
| 2002/0084402 A1 | 7/2002 | Schauer et al. | |
| 2002/0116882 A1 | 8/2002 | Reinke et al. | |

* cited by examiner

FACILITIES CONNECTION BOX FOR PRE-FACILITATION OF WAFER FABRICATION EQUIPMENT

This application is a continuation-in-part of U.S. patent application Ser. No. 09/706,435, filed Nov. 3, 2000, and Ser. No. 09/906,395, filed Jul. 15, 2001, and Ser. No. 10/099,900, filed Mar. 14, 2002 now abandoned the entire disclosures of which are incorporated herein by this reference.

FIELD OF THE INVENTION

This invention relates generally to apparatus for facilitating installation and use of wafer fabrication equipment in a manufacturing environment.

BACKGROUND OF THE INVENTION

Buildings employed for production of semiconductor wafers are specially designed to accommodate heavy manufacturing equipment and the many fluid, gas, vacuum and electrical lines (i.e., facilities lines) that are necessary for semiconductor manufacturing. In some cases, a material to be conducted by a facilities line is of a hazardous nature, and the facilities line is therefore provided as a double-containment line, to minimize the risk of the material escaping from the facilities line.

The Semiconductor Equipment Manufacturing Institute (SEMI) has proposed facilities connection locators in conjunction with a standardized equipment support pedestal upon which semiconductor manufacturing equipment may be installed. The proposed facilities connection locators facilitate pre-plumbing of facilities lines so that connection of facilities to the semiconductor manufacturing equipment can be more easily performed. However, the SEMI proposal, and other proposals in regard to facilities connection locators, have not addressed the particular requirements of providing for convenient pre-plumbing of double-containment lines which carry hazardous materials.

SUMMARY OF THE INVENTION

A first aspect of the invention provides a facilities connection box that is adapted to couple double-containment lines to semiconductor manufacturing equipment. The inventive facilities connection box includes an enclosure, a first isolation compartment defined inside the enclosure, a second isolation compartment defined inside the enclosure, and an isolation partition which defines a boundary between the first and second isolation compartments. The inventive facilities connection box also includes a first entry port associated with the first isolation compartment and adapted to couple to a first incoming double-containment fluid line and a first exit port associated with the first isolation compartment and adapted to permit egress of a first outgoing fluid line from the first isolation compartment. The inventive facilities connection box further includes a second entry port associated with the second isolation compartment and adapted to couple to a second incoming double-containment fluid line, and a second exit port associated with the second isolation compartment and adapted to permit egress of a second outgoing fluid line from the second isolation compartment. The first isolation compartment is adapted to accommodate a fluid flow path between the first entry port and the first exit port, and the second isolation compartment is adapted to accommodate a fluid flow path between the second entry port and the second exit port.

According to a second aspect of the invention, a facilities connection box adapted to couple double-containment lines to semiconductor manufacturing equipment is provided. The inventive facilities connection box according to the second aspect of the invention includes an enclosure, and a plurality of isolation compartments contained within the enclosure. Each isolation compartment is divided from an adjacent isolation compartment by an isolation partition. Each isolation compartment has associated with it a respective entry port adapted to couple to a respective incoming double-containment fluid line and a respective exit port adapted to permit egress of a respective outgoing fluid line from the respective isolation compartment. Each aspect may further include a coupling connector installed within the isolation compartment to couple a double-containment facility line (which enters the isolation compartment via the entry port) with an existing line which is bound for a semiconductor device manufacturing tool.

The inventive apparatus accommodates pre-plumbing of facilities lines, including double-containment lines carrying hazardous materials, to a location at which semiconductor manufacturing equipment is to be installed. The inventive facilities connection box may be installed in conjunction with a support pedestal on which the semiconductor manufacturing equipment is to be installed. The inventive facilities connection box may present a standardized facilities interface to the semiconductor manufacturing equipment, thereby aiding in efficient installation of the semiconductor manufacturing equipment. Moreover, the inventive facilities connection box provides isolation of hazardous material facilities lines from each other, thereby minimizing risks and adverse consequences of material leaks, and surrounds the area that is most likely to leak (i.e., the connection between the double containment line and the line that couples to the semiconductor device manufacturing equipment), with a drip container and optionally with exhaust containment.

A source of rinsing/neutralizing fluid, a leak detection sensor, and a manually or automatically controllable drain may be associated with each isolation compartment to detect and address any leak which occurs therein. The inventive facilities connection box may also accommodate facilities lines which are not double-containment lines and do not carry hazardous materials.

Other features and advantages of the present invention will become more fully apparent from the following detailed description of exemplary embodiments, the appended claims and the accompanying drawings.

DETAILED DESCRIPTION

A facilities connection box provided in accordance with the invention is adapted to handle double-containment lines which carry hazardous materials. The inventive facilities connection box includes respective isolation compartments for each incoming double-containment facilities line. A junction between the incoming double-containment line and a line connecting to the semiconductor manufacturing equipment can be located within the associated isolation compartment, so that any leak which occurs at the junction can be contained within the respective isolation compartment. A source of rinsing/neutralizing fluid, a leak detection sensor, and a manually or automatically controllable drain may be associated with each isolation compartment to detect and address any leak which occurs therein. The inventive facilities connection box may also accommodate facilities lines which are not double-containment lines and do not carry hazardous materials.

The inventive facilities connection box will be described below in connection with FIGS. 24–30. FIGS. 1–23 illustrate, by way of background, various semiconductor manufacturing equipment pedestals with which the inventive facilities connection box may be installed, or other apparatus that may be included in an installation with the inventive facilities connection box.

Figure 1:
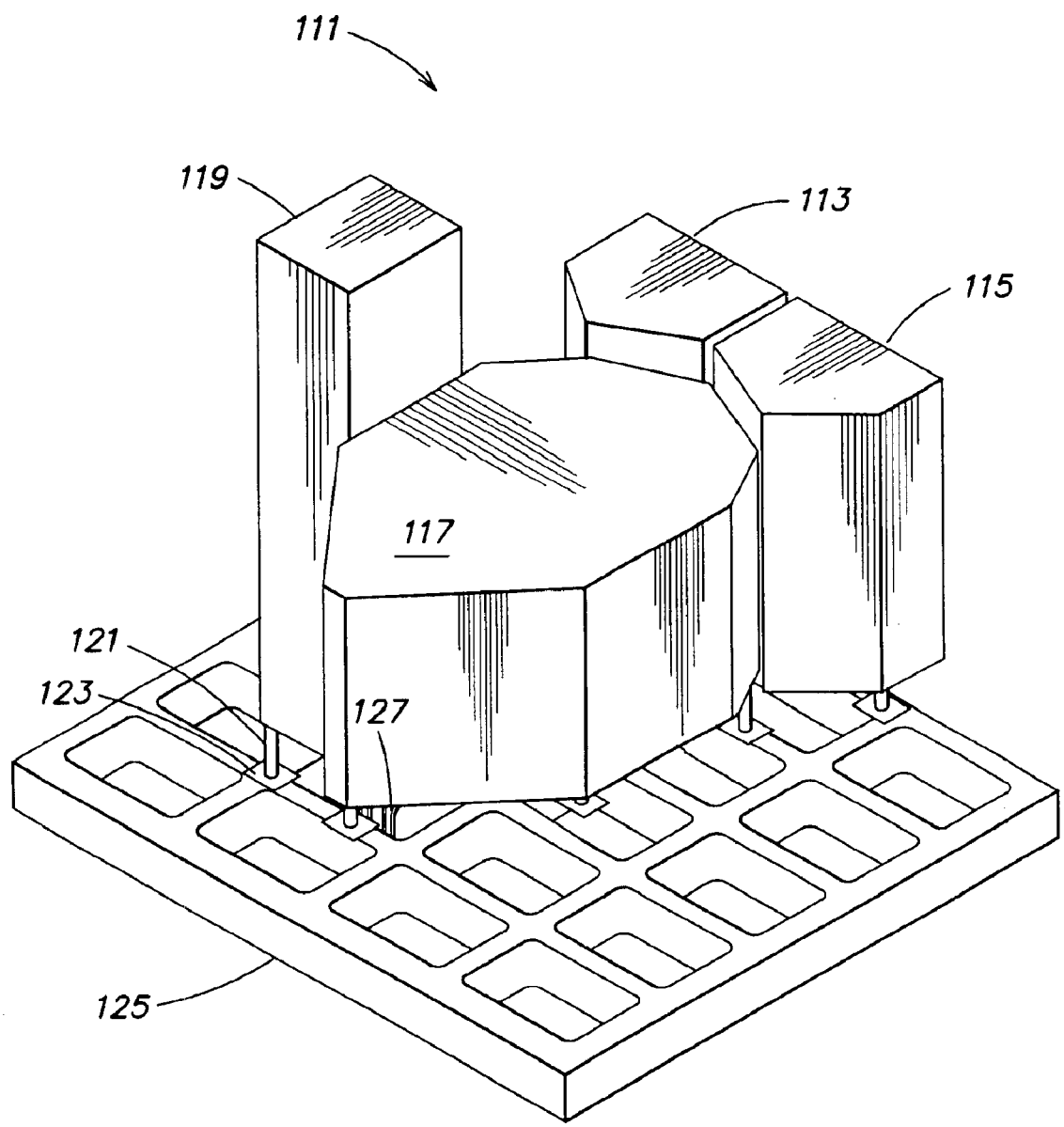
FIG. 1 is a schematic top perspective view of manufacturing equipment installed at a manufacturing location in accordance with the prior art.

FIG. 1 is a schematic top perspective view of manufacturing equipment installed at a manufacturing location in accordance with the prior art. As depicted therein, manufacturing equipment 111, shown as semiconductor processing equipment including two loadlock chambers 113 and 115, a mainframe 117 and one or more processing chambers 119 (only one shown), is supported by a plurality of support legs 121 which extend from mounting feet (not shown) on the bottom of the manufacturing equipment 111 down to base mount location pads 123 disposed on an underlying waffle-grid floor 125. Typically each of the support legs 121 is custom fabricated for the installation, in order to assure that the manufacturing equipment 111 is level, and also so as to connect the support legs to the interstices of the waffle sub-floor. Generally, the suppliers of the manufacturing equipment 111 will provide mounting feet (not shown) which are of adjustable height. In that way upon final installation of the manufacturing equipment 111, when each of the mounting feet is attached to a support leg 121, final leveling of the manufacturing equipment 111 can be conducted by adjusting the height of each of the mounting feet. While a manufacturing location will have facilities lines 127 brought to the manufacturing level, further plumbing is required for connection of the facilities lines 127 to the manufacturing equipment 111 after the physical installation (i.e., anchoring of the manufacturing equipment 111 on support legs 121 and leveling thereof) is completed. As noted above, disadvantages of the FIG. 1 prior art installation include the additional time and cost for providing customized support legs 121 and the difficulty in pre-planning or pre-facilitating the manufacturing location due to the fact that the locations of the support legs 121 may interfere with pre-plumbed facilities lines 127.

Figure 2:
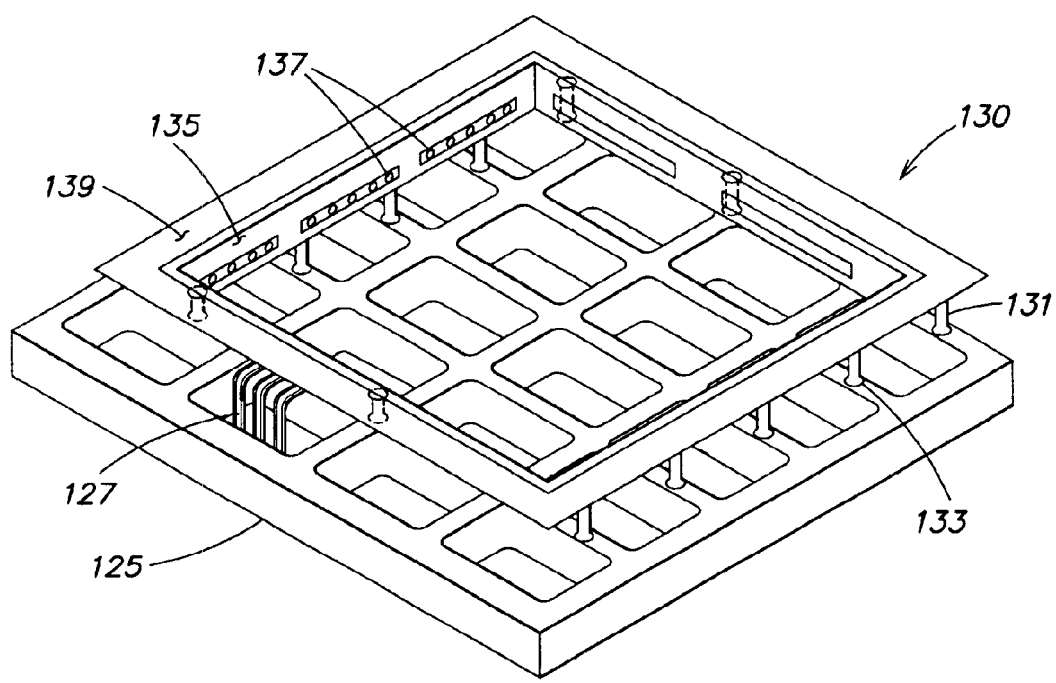
FIG. 2 is a schematic top perspective view of the proposed SEMI rectangular support pedestal installed at a manufacturing location.

FIG. 2 is a schematic top perspective view of the proposed rectangular SEMI support pedestal 130 installed at a manufacturing location. The SEMI support pedestal 130 provides an alternative to the customized support legs 121 of FIG. 1. The SEMI support pedestal 130 comprises a rectangular pedestal frame 135 supported on a plurality of SEMI support pedestal legs 131, each of which is aligned to or near one of the interstices of the waffle-grid floor 125. The SEMI pedestal frame 135 includes a plurality of SEMI facilities connection locations 137 for establishing pre-facilitation locations to which facilities lines 127 can be pre-plumbed prior to the installation of the manufacturing equipment 111 of FIG. 3. The SEMI pedestal frame 135 additionally may be adapted to support raised flooring 139.

Figure 3:
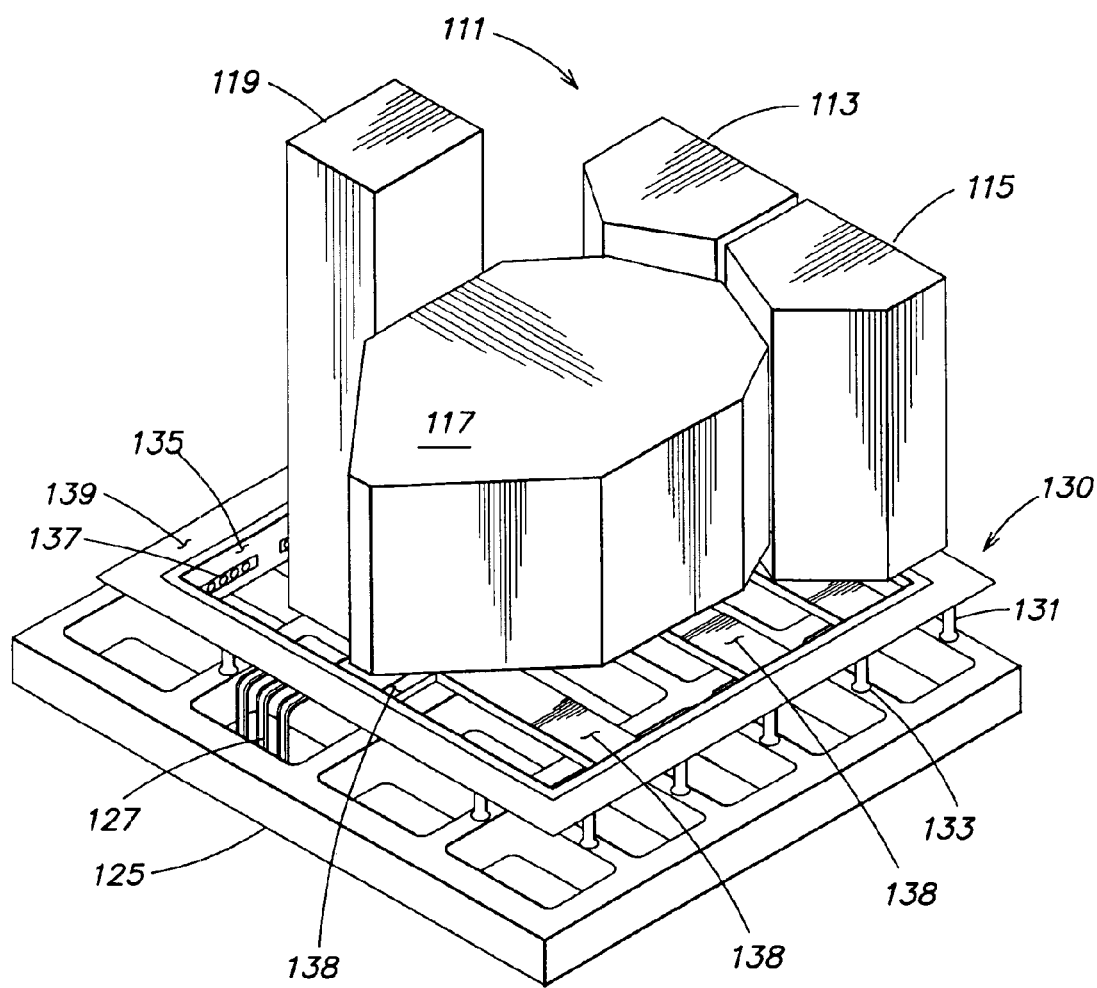
FIG. 3 is a schematic top perspective view of the proposed SEMI rectangular support pedestal with manufacturing equipment installed on the support pedestal.

FIG. 3 is a schematic top perspective view of the proposed SEMI support pedestal 130 with manufacturing equipment 111 installed thereon. With like reference numerals indicating previously-referenced components, FIG. 3 depicts the SEMI support pedestal 130 having a rectangular SEMI pedestal frame 135 disposed on a plurality of SEMI pedestal support legs 131 which extend down to base mount locations on the waffle-grid floor 125. SEMI facilities connection locations 137 are provided along the SEMI pedestal frame 135 as pre-facilitation locations for connection of facilities lines 127. When manufacturing equipment 111 is installed on the SEMI support pedestal 130, crossbeam members 138 typically must be attached to the SEMI pedestal frame 135 to support the manufacturing equipment 111, and to transfer and distribute the weight of the manufacturing equipment 111 to the SEMI support pedestal 130. Given the fact that the manufacturing equipment 111 has a unique shape, the installation of the manufacturing equipment 111 on a SEMI support pedestal 130 requires "customization" for both support and facilities connections.

The SEMI support pedestal 130, by attachment and alignment to the top edge of the SEMI pedestal frame 135, does provide the alignment and leveling reference points for installation of manufacturing equipment 111, and provides pre-plumbing reference points (i.e., the facilities connection locations 137). Nonetheless, the installation of the manufacturing equipment 111 requires customized support fabrication of the crossbeam members 138 and/or cantilevers (not shown), and customized retrofitting for connecting the facilities lines 127 from the facilities connection locations 137 to the actual facilities connection points (not shown) on the manufacturing equipment 111. As noted above, modifications to certain facilities lines can adversely affect the flow through those lines to the potential detriment of both the manufacturing process and the manufacturing equipment 111.

Figure 4:
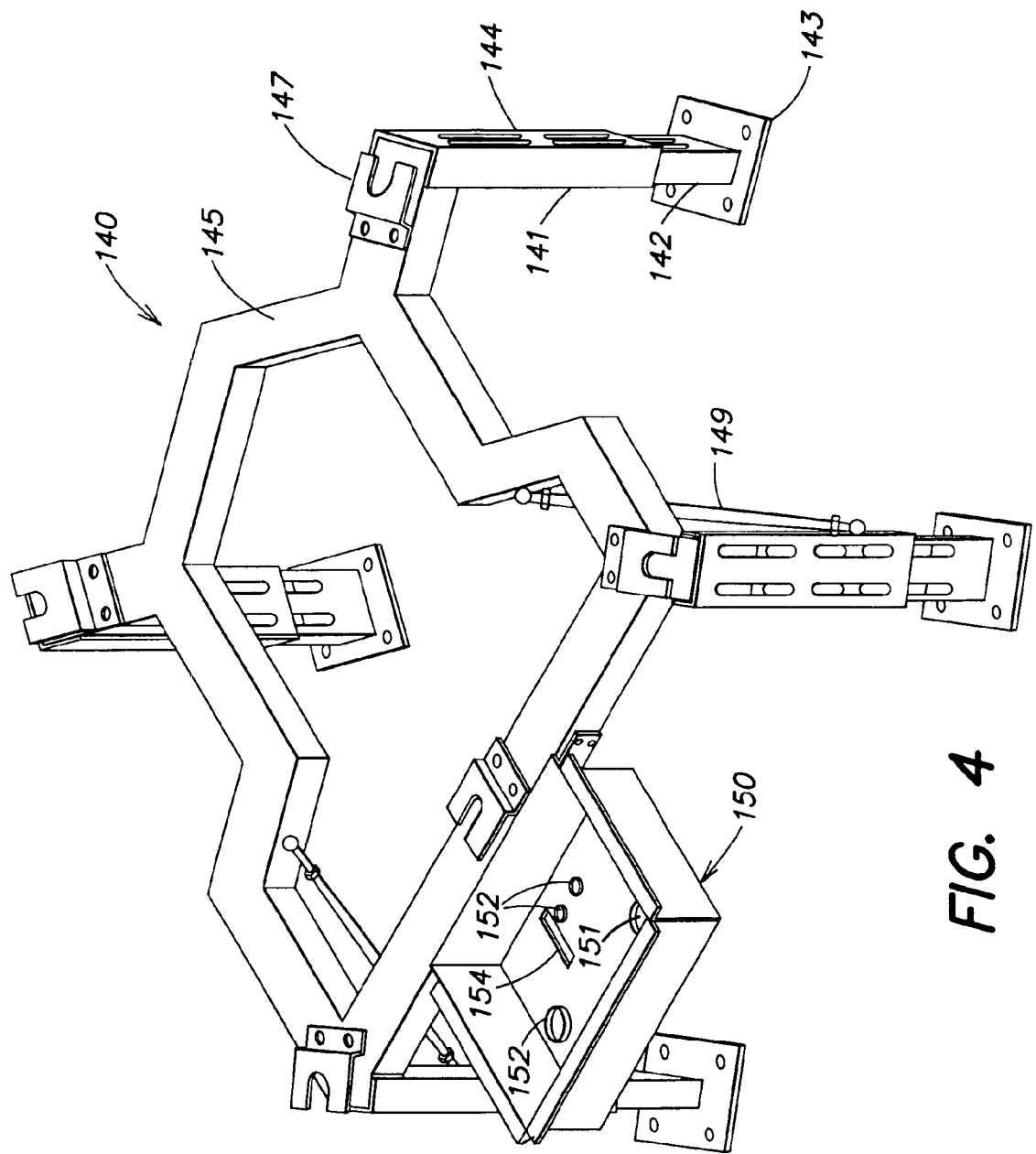
FIG. 4 is a schematic top perspective view of one embodiment of an inventive support pedestal.

FIG. 4 is a schematic top perspective view of an inventive support pedestal 140. The inventive support pedestal 140 comprises a support frame 145 having a plurality of support legs 141 extending downward there from. The support frame 145 has a frame outline which substantially duplicates the bottom outline of the mainframe 117 of the manufacturing equipment 111, with the "bottom outline" of the mainframe 117 being defined by the lower frame of the mainframe 117 itself. In one aspect the support frame 145 may be monolithic so as to provide the enhanced support integrity which comes from a "seamless" frame. The support frame 145 includes brackets 147 for engaging the load-bearing mounting feet of the manufacturing equipment (if any).

The support legs 141 are adjustable and comprise an outer leg section 144 fixedly mounted (e.g., bolted or welded) to the support frame 145, and an inner leg section 142. The inner leg section 142 is slideably mounted in the outer leg section 144, so that the length of the support legs 141 can be adjusted and, once optimized, locked in place by bolting or welding the inner leg section 142 to the first outer leg section 144. The support legs 141 are disposed on base mount location pads 143, which can be affixed (e.g., removable via bolts, or welded) to the support legs 142 prior to installation or can be provided at the installation site. Additionally affixed to the support legs 141 are optional seismic braces 149. A first end of each seismic brace 149 is fixedly mounted to a support leg 141 as shown, (or alternatively could be attached directly to the waffle grid flooring) while a second end of the seismic brace 149 is provided for attachment to the manufacturing equipment 111 upon installation thereof.

The inventive support pedestal 140 includes at least one facilities connection locator 150 which is fixedly mounted to the support frame 145 and which establishes the facilities connection locations, representatively shown as the four facilities connection locations 151–154, which exactly match the facilities connection points on the manufacturing equipment 111. Optional outer flanges (not shown) at the periphery of the support frame 145, as well as optional inner flanges (not shown) are provided for supporting raised flooring (as shown in FIG. 5).

Figure 5:
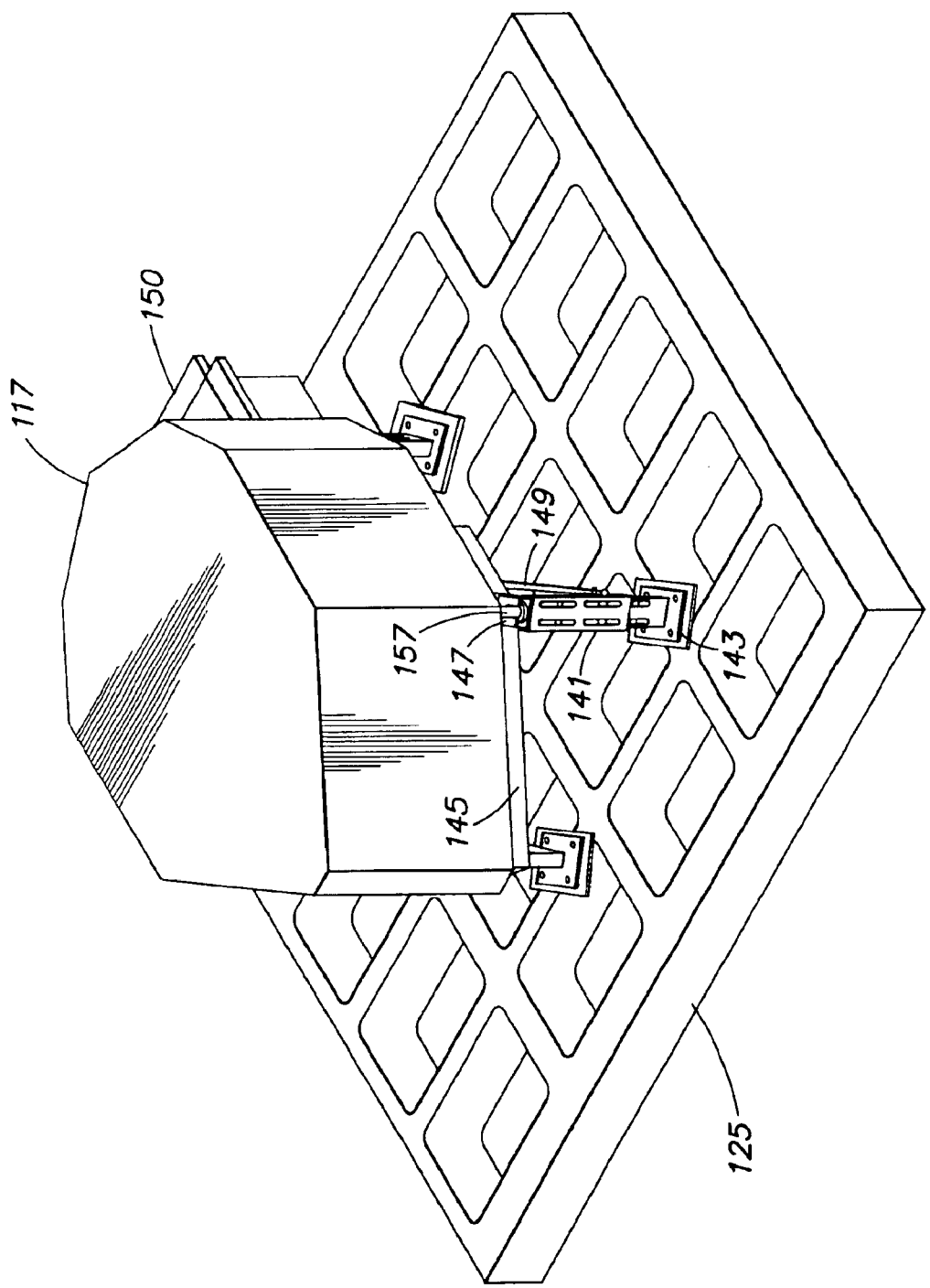
FIG. 5 is a schematic top perspective view of the support pedestal of FIG. 4 installed at a manufacturing location and having manufacturing equipment mainframe attached thereto.
Figure 8:
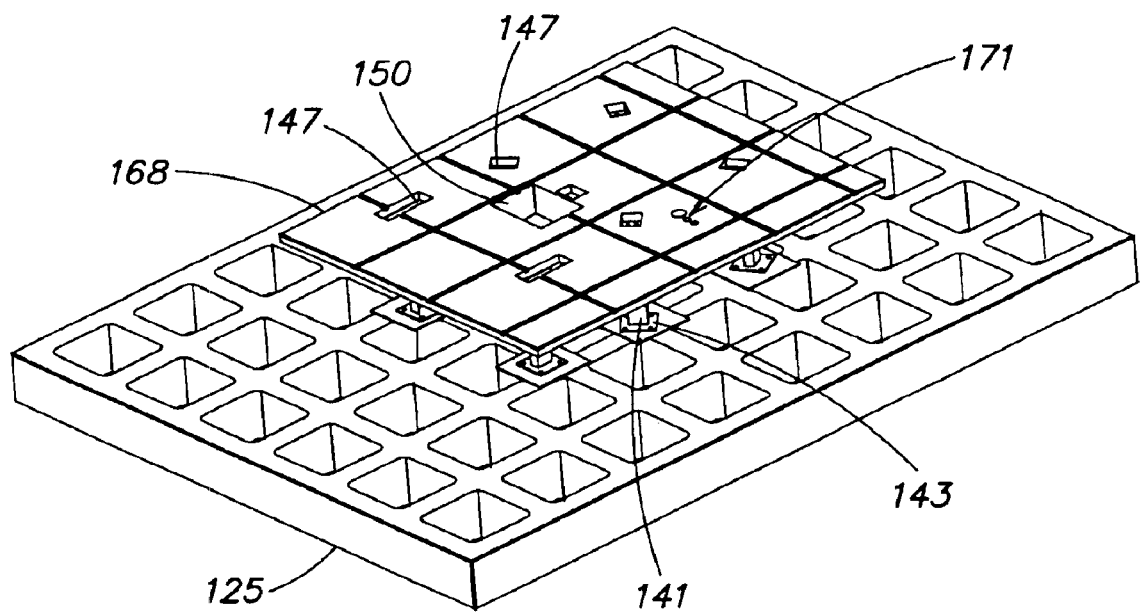
FIG. 8 is a schematic top perspective view of the support pedestal of the present invention installed below the level of a raised floor.

FIG. 5 is a schematic top perspective view of the inventive support pedestal 140 of FIG. 4, installed at a manufacturing location and having the mainframe 117 attached thereto. The inventive support pedestal 140 includes the support frame 145, having a frame outline which substantially duplicates (and preferably exactly duplicates) the bottom outline of the mainframe 117, and a plurality of support legs 141, each of which extends to a base mount location pad 143 positioned on the waffle-grid floor 125. In at least one embodiment of the invention, the frame outline need not substantially (or otherwise) duplicate the bottom outline of the mainframe 117. Seismic braces 149 are attached to the support legs 141 and to the mainframe 117. The facilities connection locator 150 is attached to the support frame 145 to provide the fixed facilities connection locations 151–154 (shown in FIG. 4). The illustrated support pedestal 140 may have raised flooring (not shown) attached at the periphery of the support frame 145. It is to be noted that the support pedestal 140 can alternatively be installed just below the level of the raised flooring, as depicted in FIG. 8 (discussed herein below).

The inventive support pedestal 140 provides manufacturing equipment alignment (due to the shape of the pedestal frame 145) and leveling (due to the adjustable legs), as well as providing fixed facilities connection locations 151–154, all of which can be established in advance of the manufacturing equipment installation with reference to a datum point 100 (FIG. 7) of the factory location. That is, a datum point is identified at the factory location and the support pedestal is aligned, leveled and plumbed with reference thereto. Since the frame outline of the support frame 145 matches the bottom outline of the mainframe 117 of the manufacturing equipment which is installed on the support frame 145, and since the quantity and positioning of the plurality of support legs 141 has been adapted to engage the manufacturing equipment's load-bearing mounting feet for support of the particular manufacturing equipment being supported by the inventive support pedestal 140, no additional support structures (such as the custom-fabricated steel jacks, concrete piers, crossbeams or cantilevers) are required. Furthermore, given the fact that all of the facilities connection locations 151–154 of the facilities connection locator 150 are pre-aligned to the facilities connection points on the manufacturing equipment itself, no retrofitting of facilities lines and connectors is required, thereby avoiding interference with flow patterns within the facilities lines. Using the factory location's datum point, therefore, the factory location can be pre-facilitated with all of the facilities lines pre-plumbed to the specified location of the facilities connection locations 151–154 at the facilities connection locator 150.

Figure 6:
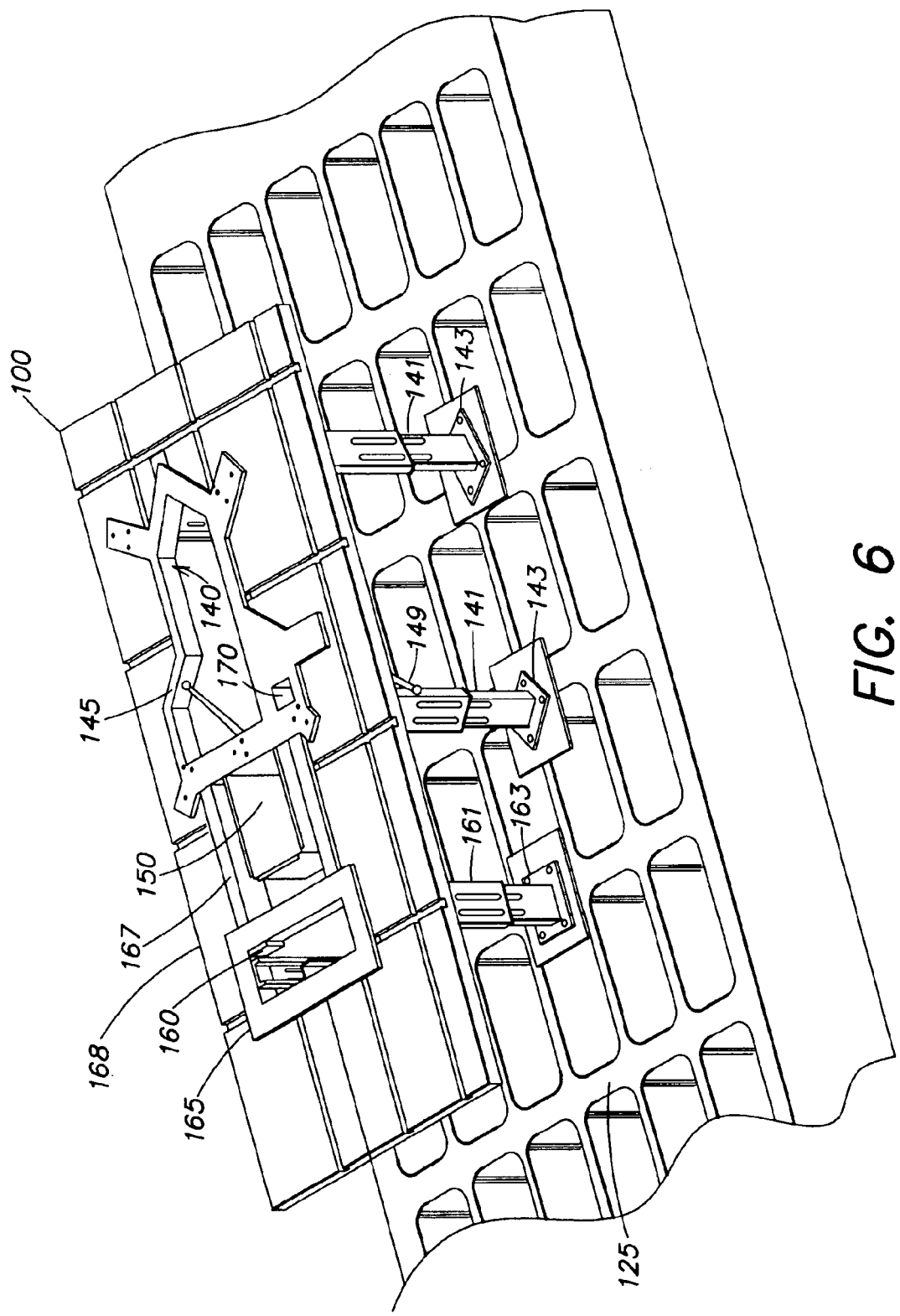
FIG. 6 is a schematic top perspective view of an alternative embodiment of the support pedestal of the present invention installed at a manufacturing location.

The support pedestal 140 is adaptable to specific manufacturing equipment configurations, as illustrated in FIG. 6.

Figure 7:
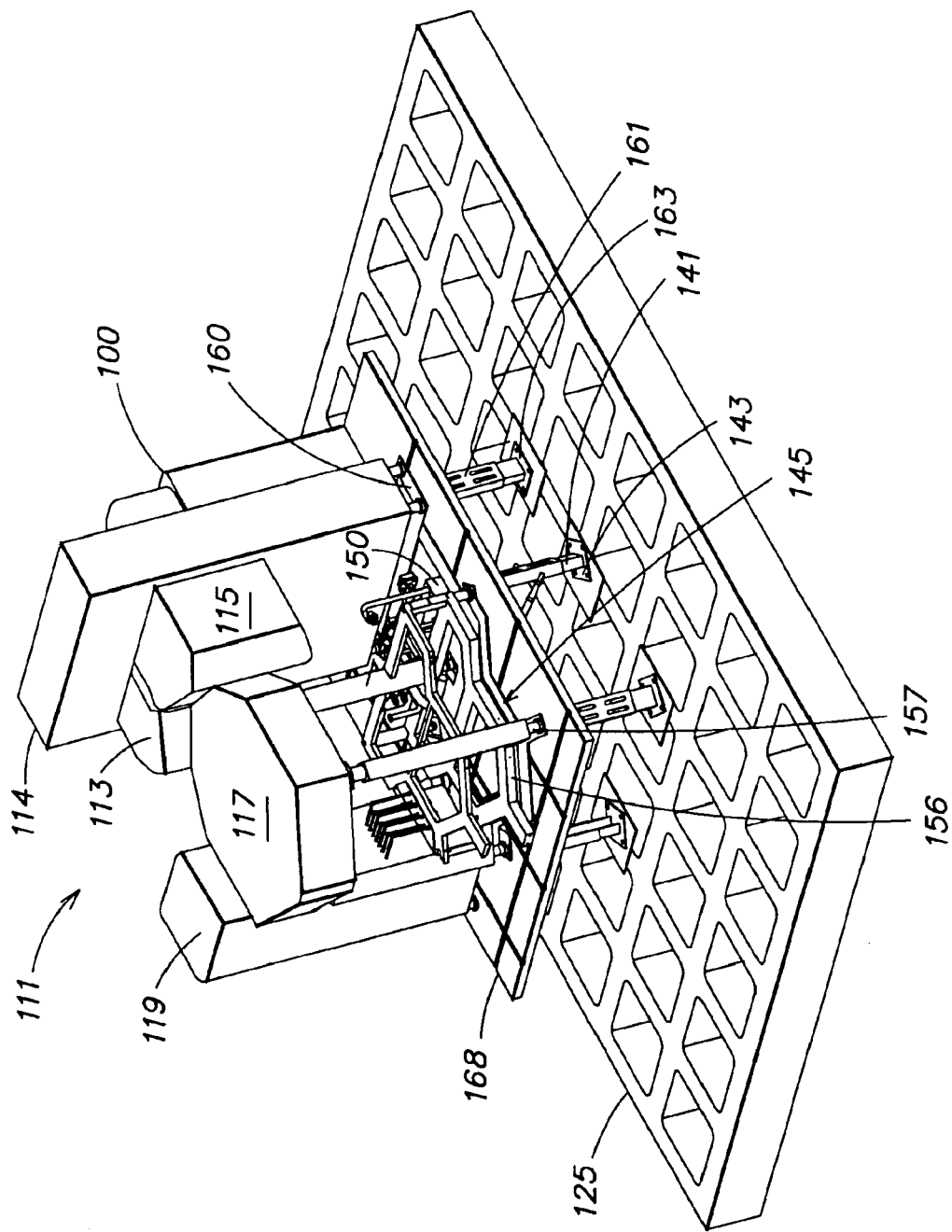
FIG. 7 is a schematic top perspective view of the support pedestal of FIG. 6 installed at a factory location with manufacturing equipment installed thereon.

For the installation of a semiconductor processing system, such as is depicted in FIG. 7, which includes not only the mainframe processing unit 117 but also the factory interface 114 with loadlock 113 and 115 and a process chamber 119, the support pedestal 140 can be augmented with at least one additional support 160, including an additional frame 165 supported by additional support legs 161 extending to additional base mount location pads 163 to support the factory interface 114, the loadlocks 113, 115 or the processing chamber 119 (FIG. 7). The components of the addition support 160 may be configured in the same manner as the components of the support pedestal 140 with adjustable legs 161 positioned below load bearing mounting of the manufacturing equipment positioned on the additional support 160 and/or frame 165 that duplicates the bottom of the manufacturing equipment. The additional support component 160 may be joined to the support pedestal 140 by connecting segments 167. Alternatively, however, the pedestal frame 140 can be extended to include the support for the additional manufacturing equipment (e.g., the processing chamber 119). Thus, a single support pedestal 140 may be configured to support one or more pieces of manufacturing equipment or a plurality of support pedestals may be coupled directly or via a connecting segment 167. In this example of FIG. 6, the support pedestal 140 includes an additional facilities connection locator 170 with additional facilities connection locations (171 of FIG. 8) as needed (e.g., for the additional processing chamber 119).

FIG. 7 is a top perspective view of the support pedestal 140 at a factory location with the manufacturing equipment 111, including the factory interface 114, the loadlocks 113 and 115, the mainframe processing unit 117 (shown partially cut away so that the bottom footprint thereof is visible) and the additional processing chamber 119 installed thereon. The illustrated additional processing chamber 119, like the factory interface 114, may be supported independently as described with reference to FIG. 6. The factory interface 114 is supported by the additional support component 160 comprising additional frame component 165 supported by additional support legs 161 which extend down to additional base mount location pads 163.

The mainframe 117 of the manufacturing equipment 111 is mounted on the support frame 145, which is in turn supported by support legs 141 which extend to the base mount location pads 143 coupled (e.g., welded or bolted) to the waffle-grid flooring 125. In the FIG. 7 embodiment, the mainframe processing unit 117 has been provided by the manufacturing equipment supplier on its own mounting frame 156 to which load-bearing mounting feet 157 are affixed. In such an embodiment, the bottom outline of the mainframe 117 is defined by the locations of the load-bearing mounting feet 157 as mounted to the mounting frame 156 (provided by the manufacturing equipment supplier) for the mainframe 117.

FIG. 8 is a schematic top perspective view of the support pedestal 140 of the present invention installed below the level of the raised flooring 168. In such an alternate embodiment, the support frame 145 (not shown) would be installed on support legs 141 which extend down to base mount location pads 143 on the waffle-grid flooring 125 as in the previously-described embodiments. Raised flooring 168 would be installed on top of the support pedestal 140, with openings provided for the facilities connection locator 150 of the mainframe 117 (not shown), for the additional facilities connection locations 171 of the additional facilities connection locator (not shown) which is provided for the additional processing chamber 119 (not shown), and for the brackets 147 which will engage the load-bearing mounting feet 157 of the manufacturing equipment 111.

Figure 9:
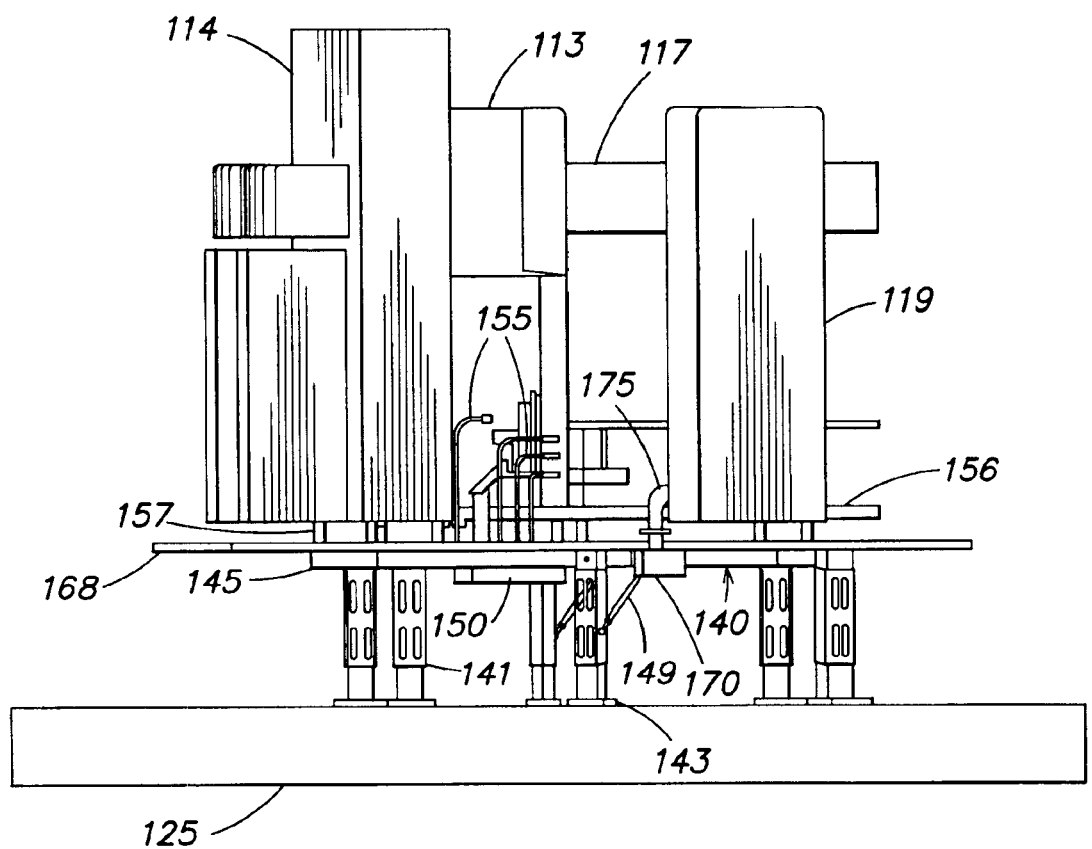
FIG. 9 is a side view of the embodiment of FIG. 8 with manufacturing equipment installed thereon.

FIG. 9 is a side view of the embodiment of FIG. 8 with manufacturing equipment 111 installed thereon. As shown therein, the raised flooring 168 has the openings for brackets 147 (FIG. 8) which accommodate load-bearing mounting feet 157. The mainframe processing unit 117 is provided on its mounting frame 156 which includes load-bearing mounting feet 157 to be attached to the brackets 147 (FIG. 8) of the underlying support pedestal 140. The support frame 145 of the support pedestal 140 is fixedly attached to the plurality of support legs 141, each of which extends to and is coupled to the base mount location pads 143 on the waffle-grid floor 125. Facilities connections 155 are shown projecting up from the facilities connection locations 151–154 (not shown) of facilities connection locator 150 to be provided to the mainframe processing unit 117. The additional processing chamber 119 has additional facilities connections 175 extending up through its additional facilities connection locations 171 (FIG. 6) associated with the additional facilities connection locator 170.

Figure 10:
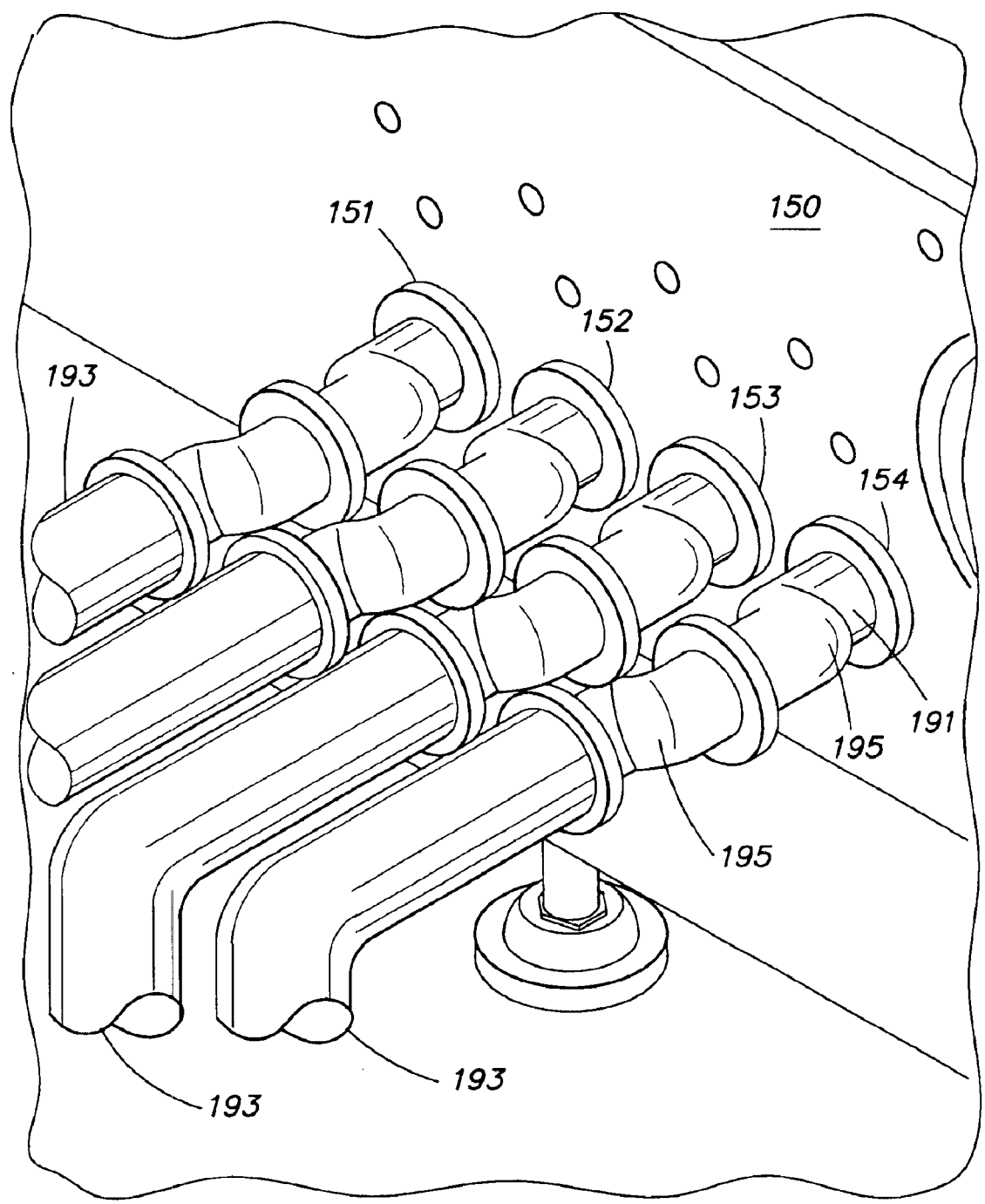
FIG. 10 is a side view of gooseneck connectors at an inventive facilities connection locator.

FIG. 10 is a side view of gooseneck connectors 191 which provide facilities connection between the facilities supply lines 193 of a factory location and the facilities connection locations 151–154 of a facilities connection locator 150 of the present invention (or any other facilities connection locations). The gooseneck connectors 191 comprise a plurality of connector segments 195 which are alternately oriented to flexibly approximate a "straight" flow path between the facilities supply lines 193 and the facilities connection locations of the facilities connection locator 150.

The invention has been described with reference to several specific embodiments. One having skill in the relevant art will recognize that modifications may be made without departing from the spirit and scope of the invention. For example, it is to be noted that the manufacturing equipment 111 may include some non-load-bearing feet (hereinafter referred to as "anchoring feet") which may be provided for additional lateral securing of the manufacturing equipment to the support frame 145. The number and locations of the support legs 141 of the inventive support pedestal 140 are selected to match the number and locations of the load-bearing mounting feet 157 on the bottom outline of the manufacturing equipment. It is to be understood that, without departing from the invention as taught and claimed, additional anchoring feet may be provided on the manufacturing equipment, and additional brackets for engaging the anchoring feet may be provided on the inventive support pedestal 140 in locations which may or may not align with support legs 141.

In addition, the illustrated seismic braces, including variable length ball-end rods 149 of FIG. 4, are merely representative of one embodiment of the optional feature. An alternative embodiment would include a piece of thick metal strapping, which would first be secured to the support leg, followed by custom-bending in situ, and then bolting or welding into place. By either method, the support pedestal would be triangulated in orthogonal directions, thus preventing the vertical support legs from deforming to the point of failure during a seismic event.

While it has been taught that a molded, monolithic pedestal frame is advantageous for mechanical integrity, clearly a pedestal frame comprising a plurality of bonded (e.g., welded) or fixedly coupled (e.g., bolted) pieces can be substituted without departing from the invention as claimed.

Yet another modification comprises the use of standardized spacers as the mounting and anchoring feet, in place of the adjustable mounting and anchoring feet which have traditionally been employed for in situ leveling of manufacturing equipment. The inventive support pedestal has adjustable legs which are adjusted prior to installation of the manufacturing equipment to thereby pre-establish the alignment and leveling of the manufacturing equipment; therefore, fixed spacers are recommended since the fixed spacers maintain the fixed parallel relationship between the support frame and the manufacturing equipment which has been established relative to the datum point and since no in situ leveling of the manufacturing equipment will be required.

The support leg sections could also be. tubular, right angle sections ("angle iron"), or triangular or etc., they need not be rectangular. Also, the lower portion of the support leg could be either the outer or the inner portion. As an alternative to being bolted-on, the mounting of the support legs to the pedestal frame could also be welded-on, designed so that they would attach underneath the frame (in compression), or designed to fit into underside receptacles fabricated as part of the frame itself, or some combination of these.

Finally, pre-facilitation of a factory location can be conducted using a "map" of the support pedestal and its facilities connection locator with facilities connection locations defined relative to a datum point of the factory location. A medium (polycarbonate film) having a full-scale outline of the inventive support pedestal, with or without facilities connection locations denoted, can be delivered to the factory location prior to installation of the support pedestal. Once the polycarbonate film is spread out on the factory floor relative to the datum point, the x and y coordinates (i.e., the coordinates in the horizontal plane) for each facilities connection location will be precisely defined in situ and appropriate plumbing, electrical, construction can be performed prior to installation of the inventive support pedestal.

Figure 11:
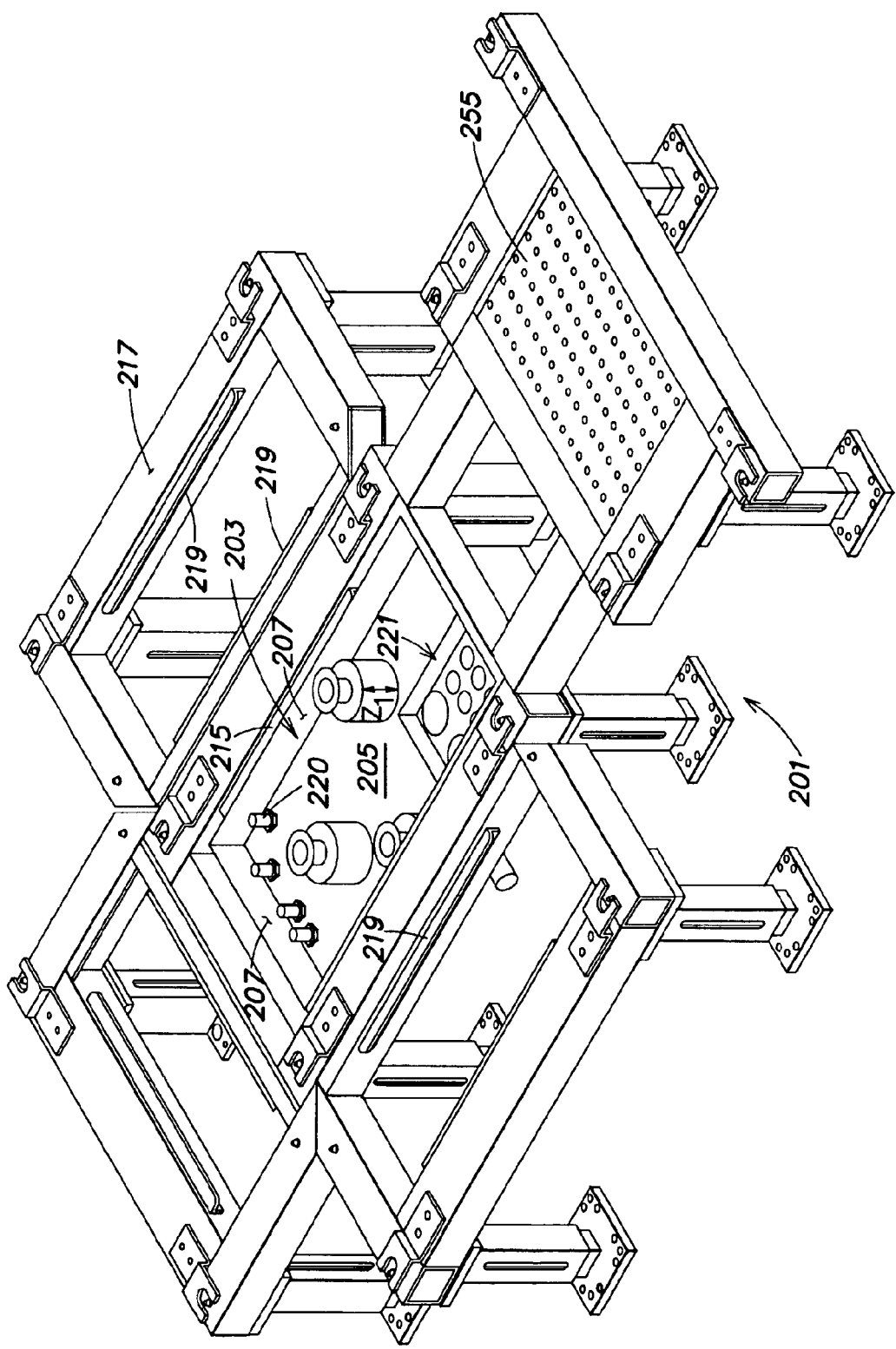
FIG. 11 is an isometric view, taken from above, of a manufacturing equipment support apparatus, showing an improved facilities connection locator coupled thereto.

FIG. 11 is an isometric view, taken from above, of a manufacturing equipment support apparatus 201, showing an improved facilities connection locator 203 coupled thereto. The facilities connection locator 203 comprises a bottom surface 205 and a plurality of side walls 207 extending upwardly therefrom so as to form a fluid tight "bucket". The facilities connection locator 203 has at least one fluid connection port formed therein and may also have any number of vacuum connection ports, and/or facilities connection plates, the features of which are best understood with joint reference to FIG. 11 and to FIGS. 12–17 which show various views of the facilities connection locator 203 and/or its facilities line connectors.

Figure 12:
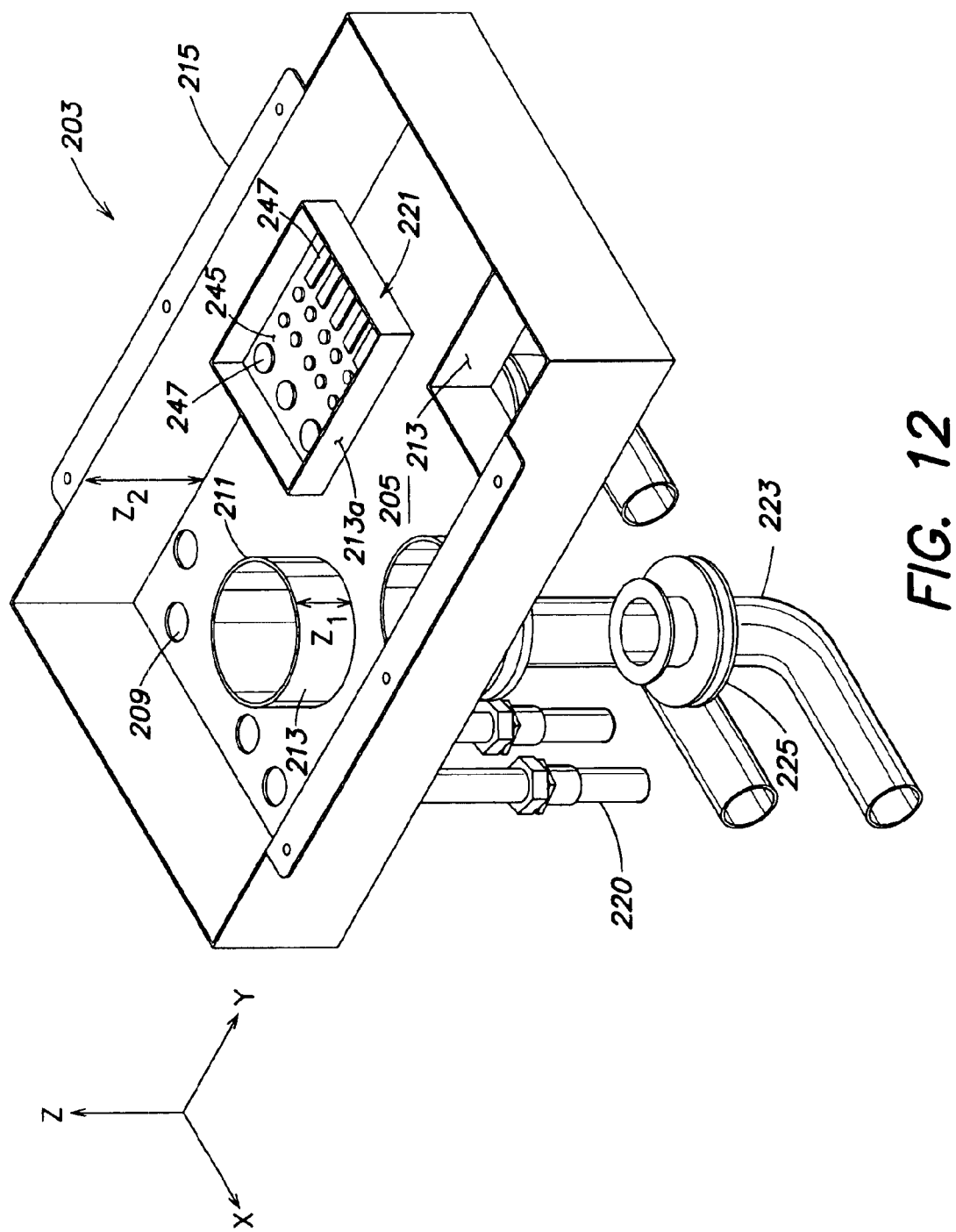
FIG. 12 is an exploded close up isometric view of the facilities connection locator of FIG. 11, taken from above.
Figure 16:
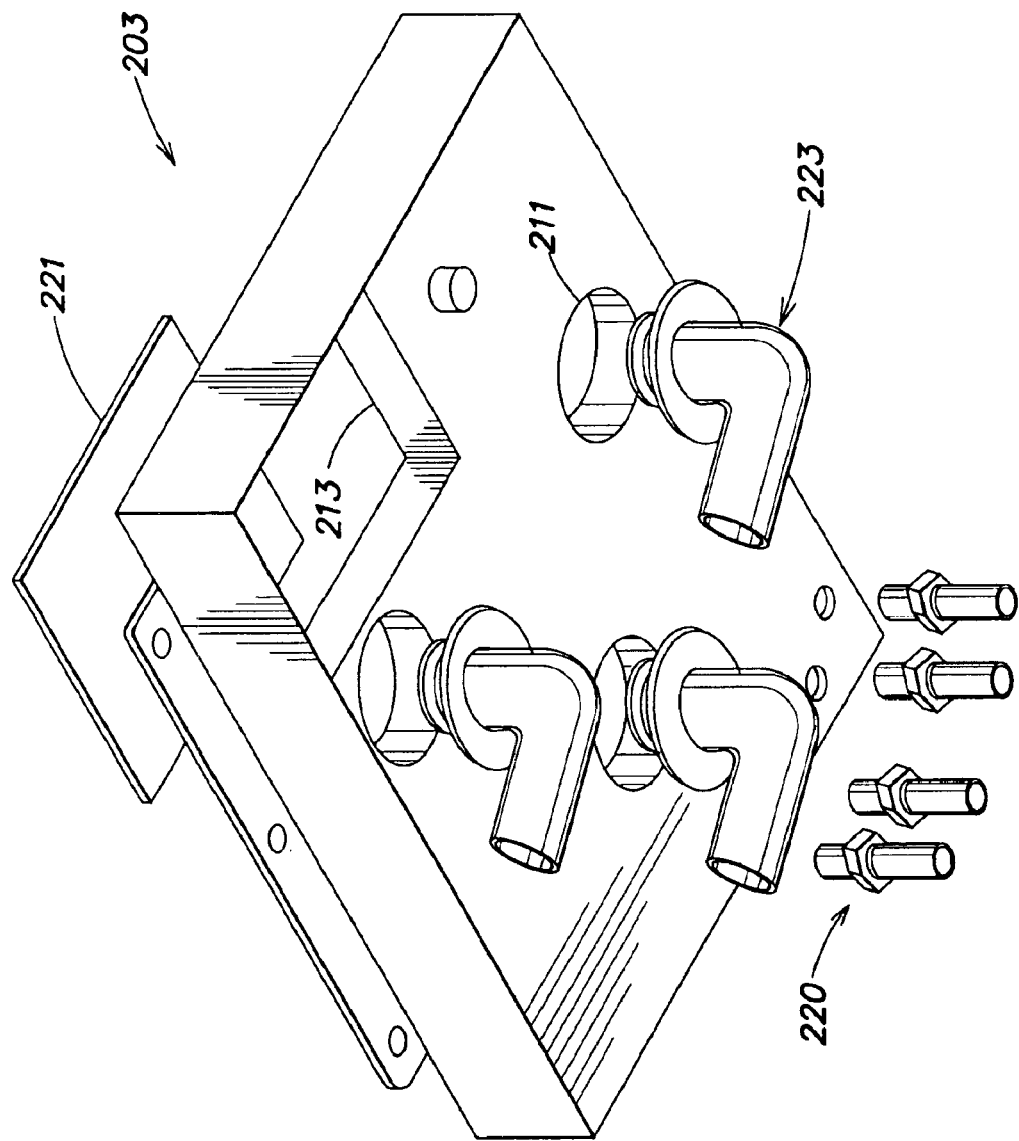
FIG. 16 is an exploded close up isometric view of the facilities connection locator of FIG. 11, taken from below.

The exemplary facilities connection locator 203 shown comprises four fluid connection ports 209 (FIG. 12) and three vacuum connection ports 211 (FIG. 12 and FIG. 16). Each vacuum connection port 211 is shown surrounded by a riser 213.

A mounting mechanism (such as mounting flanges 215) extends from the facilities connection locator 203 and interfaces with features of the equipment support apparatus 201 so that the facilities connection locator 203 is mounted to the equipment support apparatus 201 with a predetermined relationship (i.e., such that features of the facilities connection locator 203 are fixed in the x-axis and y-axis directions relative to the outline or footprint of the equipment support apparatus 201, and are fixed in the z-axis direction relative to a top surface 217 of the equipment support apparatus 201). In the exemplary embodiment shown, the mounting flanges 215 of the facilities connection locator 203 rest on corresponding mounting flanges 219 located within the footprint of the equipment support apparatus 201 and recessed slightly below the top surface 217 of the equipment support apparatus 201 such that the top surface of the facilities connection locator 203 and the mounting flanges 215 thereof are flush with the top surface 217 of the equipment support apparatus 201.

Consider, for example the riser 213, each of which extends a predetermined height $Z_1$, above the bottom surface 205. Accordingly, because the bottom surface 205 is a predetermined height $Z_2$ below the top surface 217, the z-axis position of the top of the riser 213 is known relative to the top surface 217. The same principle is true for the remaining features of the equipment support apparatus 201, such as the z-axis position of any fluid line connectors 220 relative to the top surface 217 or the z-axis position of any facilities connection plate 221 relative to the top surface 217.

Figure 13:
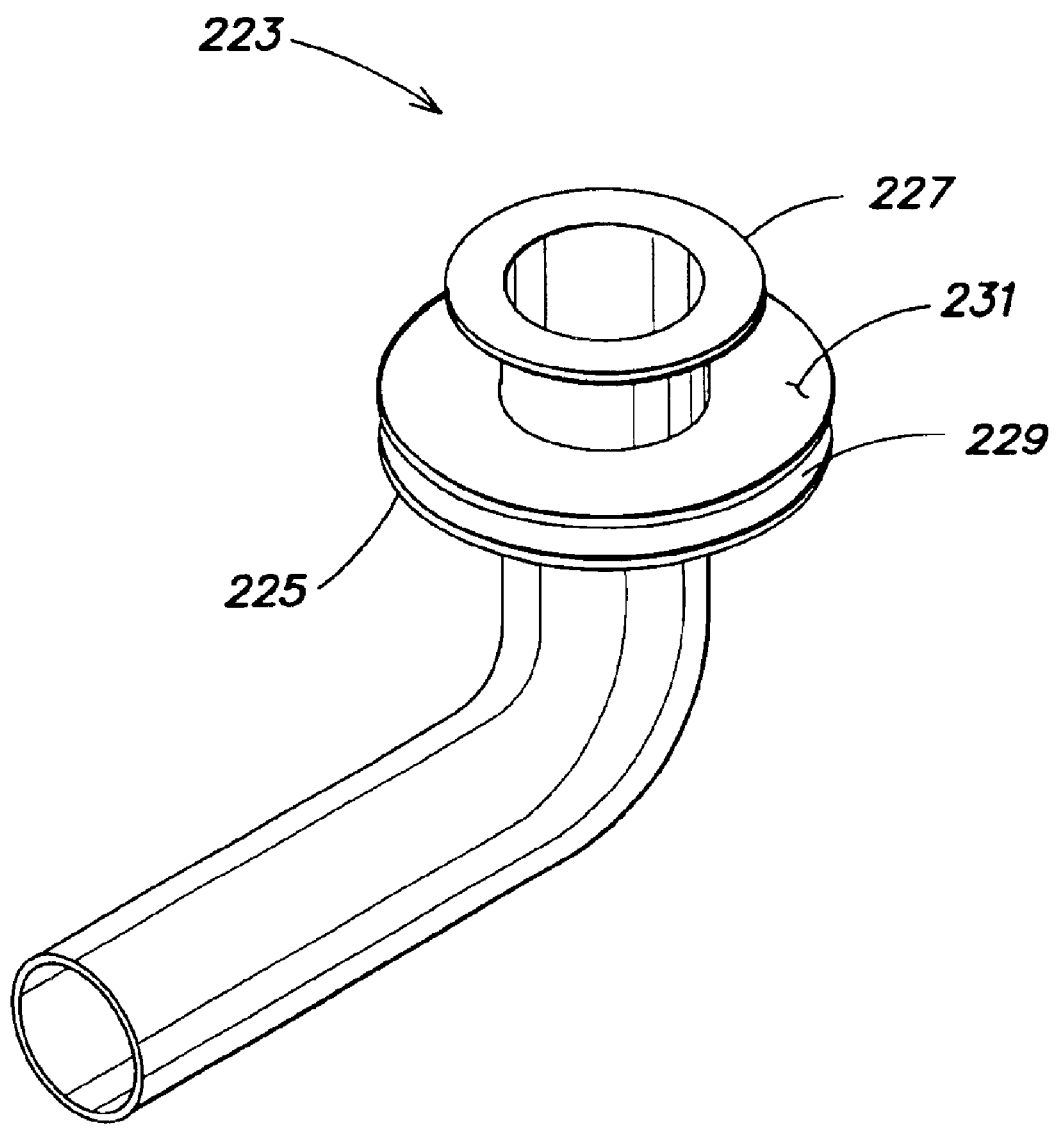
FIG. 13 is an isometric side view, taken slightly from below, of a facilities connection line of FIG. 11.
Figure 14:
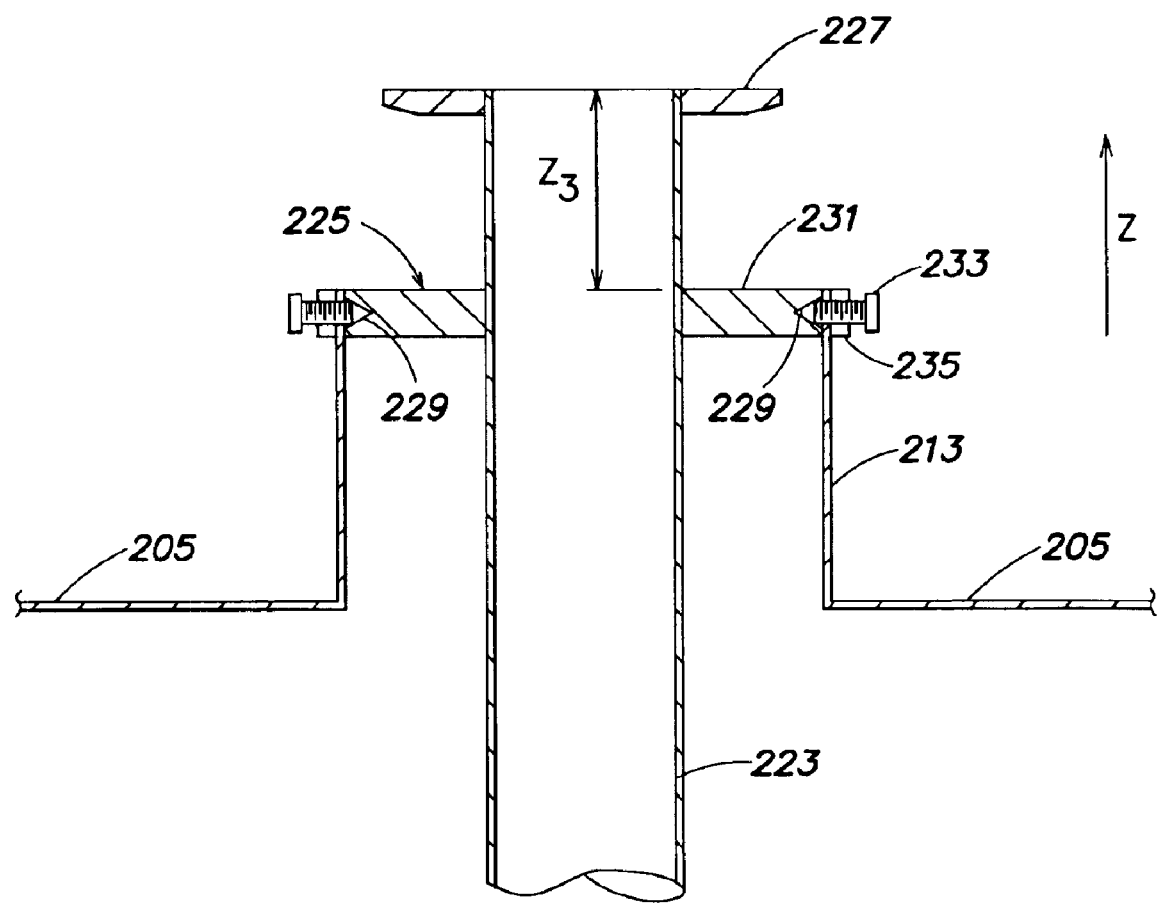
FIG. 14 is a side view showing the facilities connection line of FIG. 13 coupled to a facilities connection port in a fixed relationship.

The riser 213 may be employed with a facilities connection line 223 having a z-axis locating mechanism such as a locating flange 225, best understood with reference to FIGS. 13 and 14. As shown in FIGS. 13 and 14, the facilities connection line 223 has a top surface 227 which may comprise a flange, as shown. The top surface 227 has a fixed height relationship $Z_3$ with respect to the top of the riser 213 (FIG. 14). Thus, as the top of the riser 213 has a fixed z-axis position with respect to the top surface 217, so does the top surface 227.

In order to facilitate accurate z-axis positioning/mounting between the locating flange 225 and the riser 213, the locating flange 225 may comprise a V-shaped groove 229, and the riser 213 may comprise a plurality of holes (not shown) formed at a predetermined height above the bottom surface 205. In one aspect the V-shaped groove 229 and the holes (not shown) in the riser 213 are configured such that when a top surface 231 of the locating flange 225 is flush with the top surface of the riser 213, the center of the V-shaped groove 229 is adjacent the holes. A screw 233 may then be threaded through a nut 235 and through the hole in the riser 213 so as to extend into the center of the V-shaped groove 229. As will be apparent, the nut 235 ensures that the screw 233 is normal to the hole in the riser 213, and the normally positioned screw 233 contacts the equally sloped sides of the V-shaped groove 229 ensuring that the facilities connection line 223 is precisely positioned in the z-axis direction. Although the facilities connection line 223 is shown only as a vacuum line connection in the figures, it will be understood that the facilities connection line 223 also may be employed as a fluid line connector.

Figure 15A:
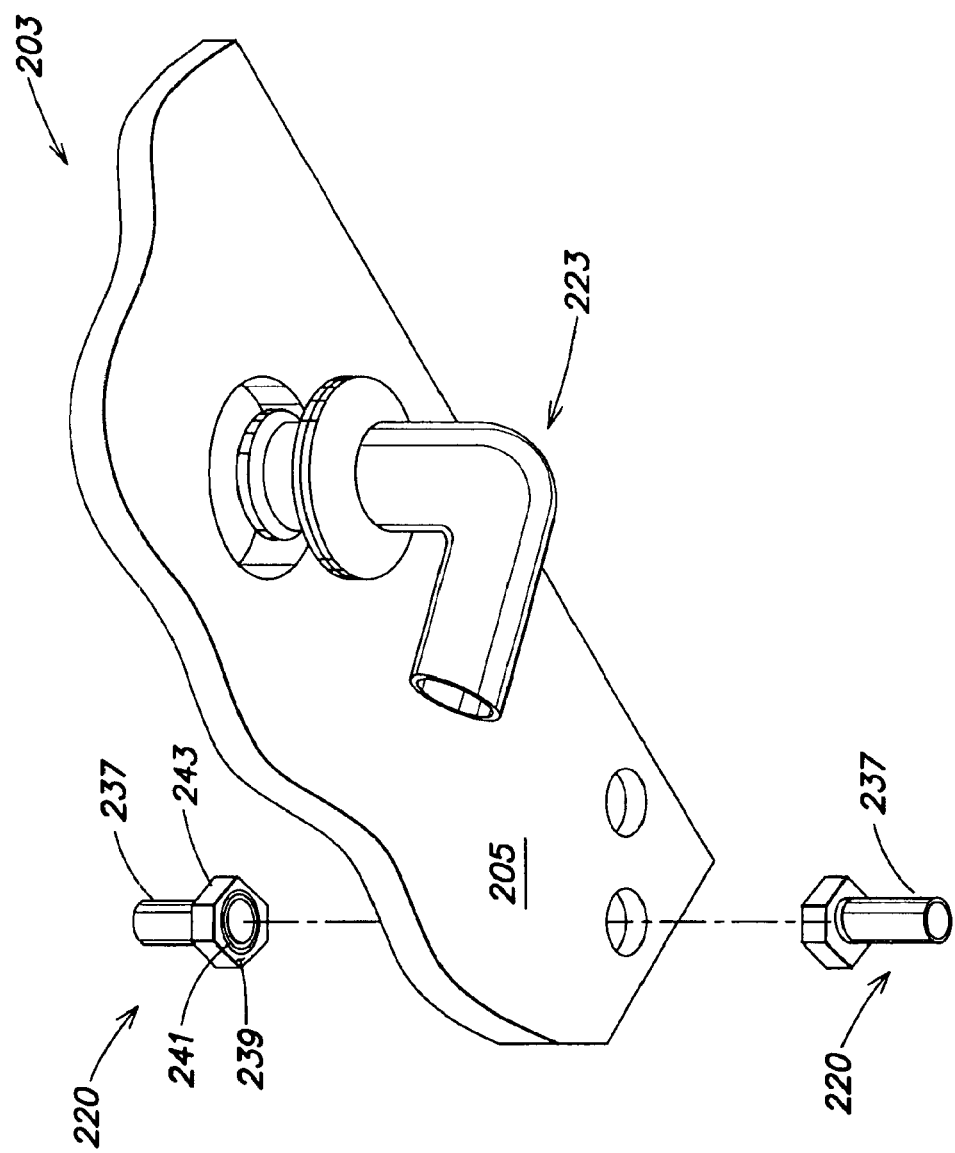
FIG. 15A is a bottom isometric view of a first fluid line connector.

In one aspect, the fluid line connectors 220 may be configured as shown in the bottom isometric view of FIG. 15A. Each fluid line connector 220 comprises a fluid line 237 having a planar surface 239 that extends horizontally from the fluid line 237 and, when coupled to the facilities connection locator 203, is positioned such that the planar surface 239 extends along the interior side of the facilities connection locator 203's bottom surface 205. An o-ring 241 is disposed along the planar surface 239 so as to form a fluid tight seal between the planar surface 239 and the interior side of the facilities connection locator 203's bottom surface 205. A portion of the fluid line 237 that is to extend downward from an exterior surface of the facilities connection locator 203's bottom surface 205 is threaded (not shown) so that a threaded bolt 243 may be threaded thereon, as shown. Thus, the bolt 243 may be tightened such that the o-ring 241 is held firmly between the planar surface 239 and the facilities connection locator 203's bottom surface 205, forming a fluid tight seal. Because the planar surface 239 has a fixed offset from the top of the fluid line 237, and the fluid line 237 has a known height, the top of the fluid line 237 is a fixed or known distance from the bottom surface 205 of the facilities connection locator 203, and from the top surface 217.

Figure 15B:
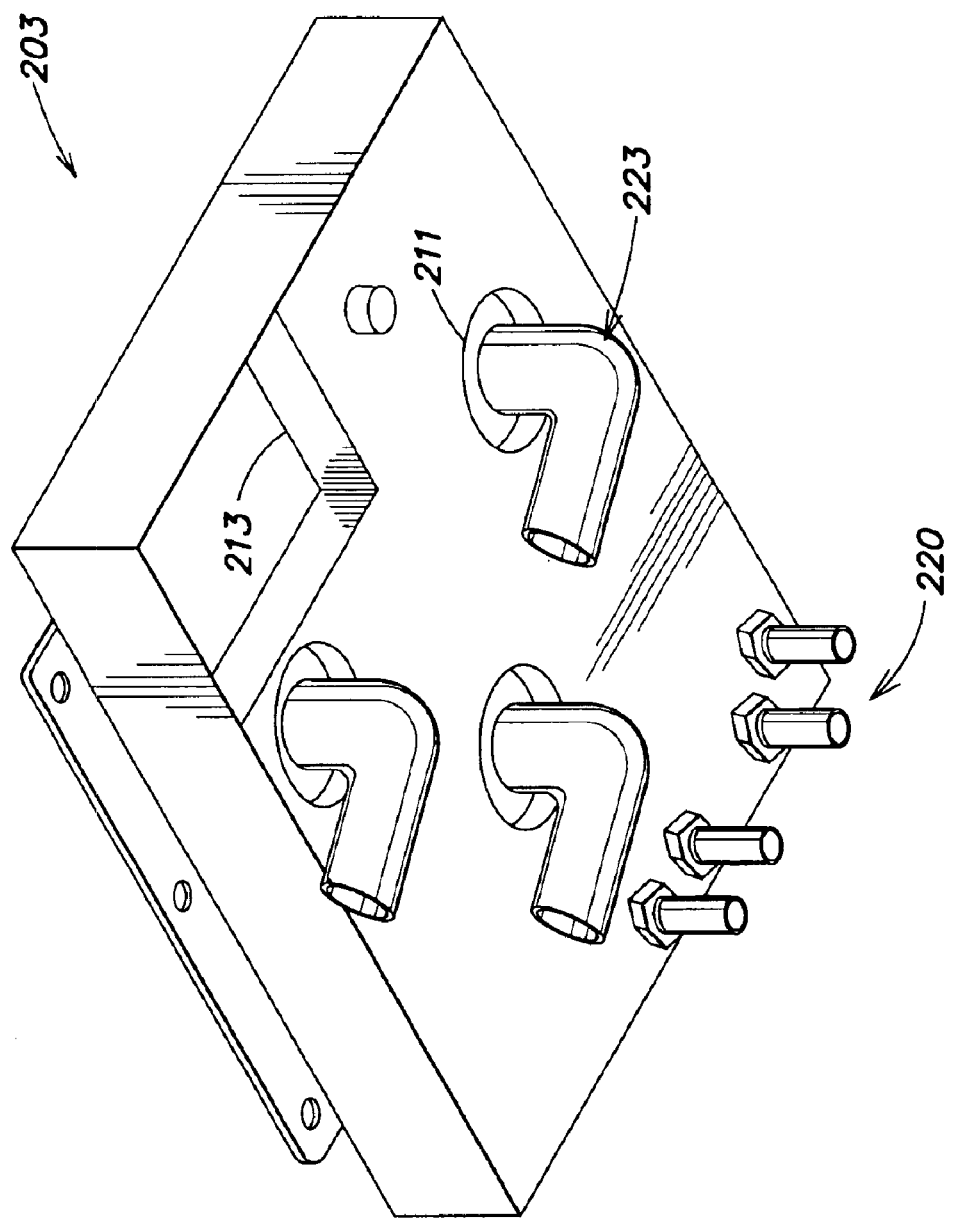
FIG. 15B is a bottom isometric view of a second fluid line connector.

Any of the connections described above may also be welded to the facilities connection locator 203, as shown in FIG. 15B. By welding or otherwise integrally forming vacuum and/or fluid line connectors to the bottom surface 205, the facilities connection locator 203 is fluid tight without the need for the special fluid tight design of the fluid line connectors 220 described above, and without the need for the riser 213. Further, the welded or integrally formed fluid line connectors 220 and facilities connection lines 223 will have fixed positions (in the x-y and z axis) relative to the facilities connection locator 203 and hence relative to the top surface 217 of the equipment support apparatus. Such welded/integral fluid line connectors 220 and facilities connection lines 223 are shown in the isometric view of FIG. 15B, and may also have an optional industry standard clamp flange (not shown).

Figure 17:
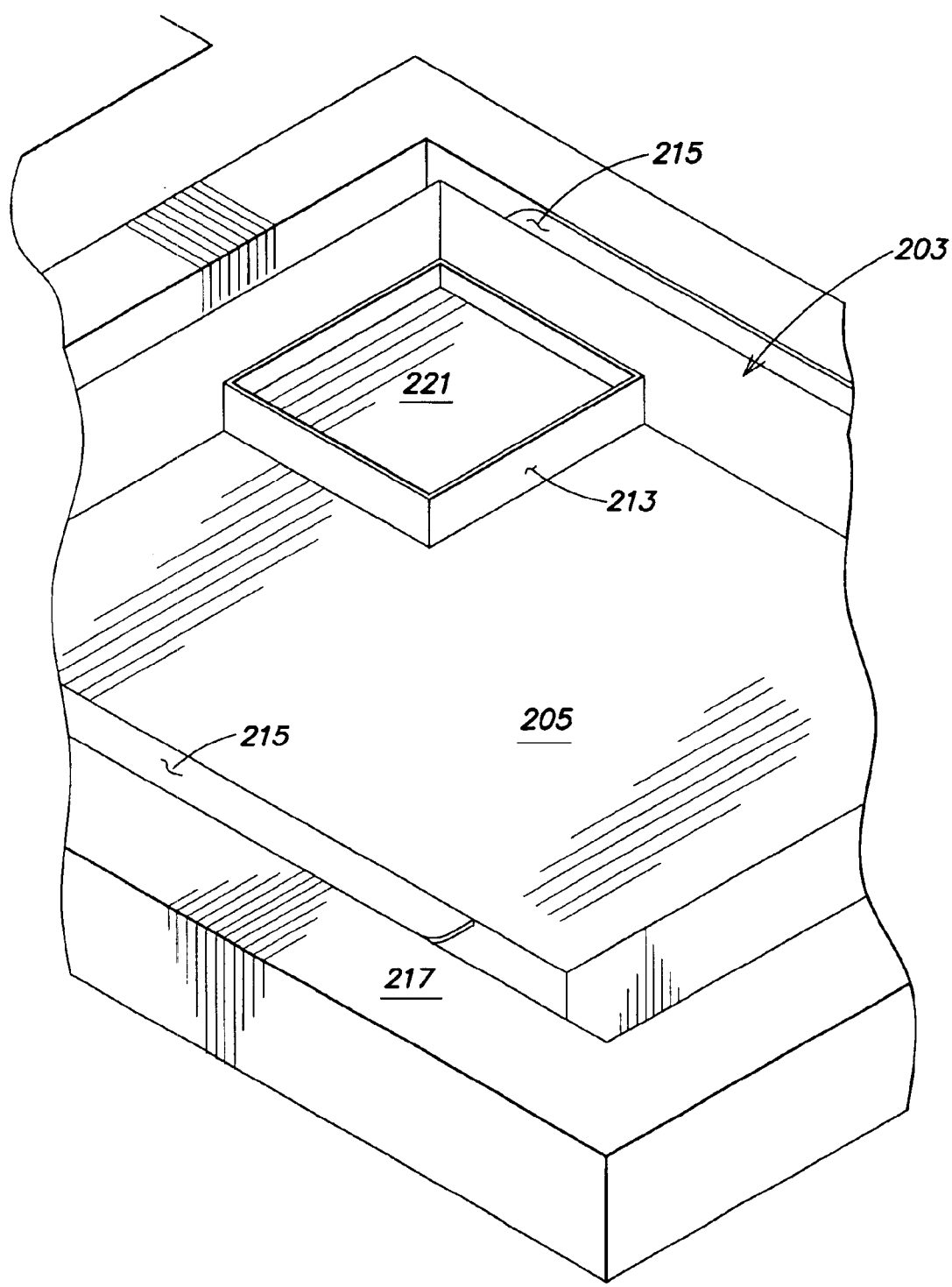
FIG. 17 is a close up isometric view of the facilities connection locator of FIG. 11 taken from above and at an angle that better shows a riser surrounding a facilities connection plate thereof.

An optional feature of the facilities connection locator 203 is the facilities connection plate 221, which is best shown by FIGS. 16 and 17. FIG. 16 is an exploded close up isometric view of the facilities connection locator 203, taken from below; and FIG. 17 is a close up isometric view of the facilities connection locator 203 taken from above and at an angle that better shows a riser 213 that surrounds the facilities connection plate 221.

As with the vacuum connection port 211, the riser 213 surrounds the facilities connection plate 221 so that if fluid should fill the facilities connection locator 203, the facilities connection plate 221 will be protected therefrom. As best shown in FIG. 12 the facilities connection plate 221 may also have an integrally formed riser 213a which makes mounting of the facilities connection plate 221 easier. The integrally formed riser 213a may also have welded corners so as to be fluid tight. The connection plate's riser 213a is adapted to couple to the riser 213 so that a bottom surface 245 of the facilities connection plate 221 is a fixed height above the bottom surface 205 of the facilities connection locator 203, and thus, is a fixed height offset from the top surface 217. Alternatively, rather than a riser, the connection plate 221 may have an integral edge that extends downwardly to facilitate mounting of the connection plate 221. The facilities connection plate 221 has a plurality of removable panels 247 (e.g., knock out panels with perforated edges that facilitate easy removal) that may be individually removed to allow facilities lines (e.g., electrical, gas, fluid or pressure lines, etc.) to pass therethrough.

Figure 18:
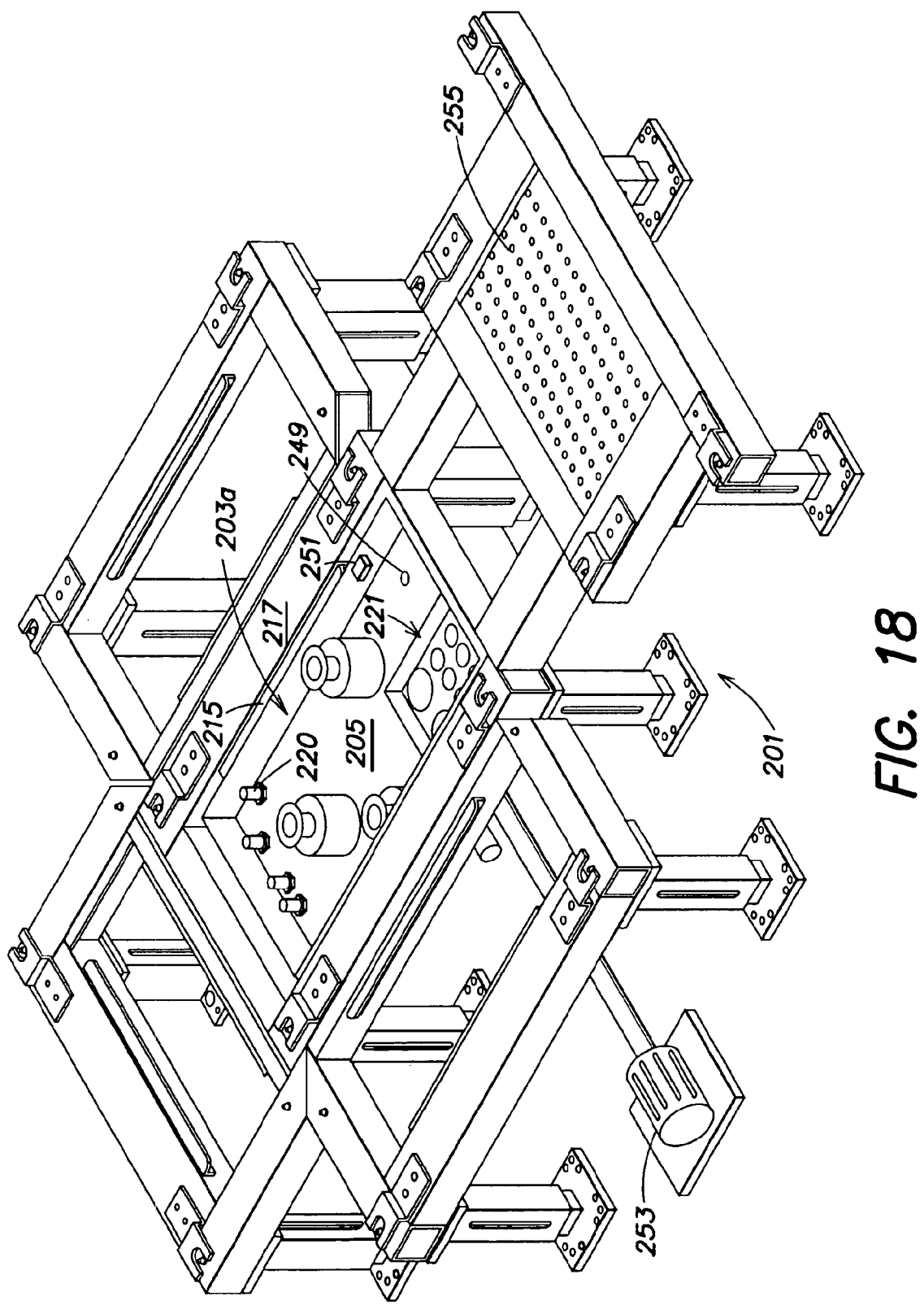
FIG. 18 is an isometric view, taken from above, of a manufacturing equipment support apparatus, showing an improved facilities connection locator coupled thereto and having additional features not shown in FIG. 11.

FIG. 18 is an isometric view, taken from above, of a manufacturing equipment support apparatus, showing an improved facilities connection locator 203a coupled thereto and having additional features not shown in FIG. 11. The facilities connection locator 203a has the additional feature of a gravity drain 249, located on the bottom surface 205 of the fluid tight bucket 203. The bottom surface 205 may be sloped, such that the drain 249 is at a slightly lower elevation than the remainder of the bottom surface 205. Also shown in FIG. 18 is a liquid level sensor 251 that detects when fluid in the facilities connection bucket 203 has reached a certain level. The liquid level sensor 251 may be coupled to a controller (not shown) that will notify an operator of the fluid level, will shut of the fluid flow through the fluid line(s) connected to the facilities connection locator 203 and/or will activate a fluid pump coupled to the facilities connection locator 203. A fluid pump 253 which automatically begins to pump fluid when it senses the same may also be employed.

A further feature that may be employed with any equipment support apparatus, is an airflow control plate 255 as shown in FIG. 11. The airflow control plate 255 may be mounted to the support apparatus via a plurality of flanges or any other suitable mechanism. The airflow control plate 255 has a plurality of openings (e.g., in a preferred embodiment evenly distributed holes of equal size) to control airflow. The plate may be adapted to fully or partially occupy an interior region of the support apparatus' frame outline. Accordingly, where gaps exist between the installed equipment and the pedestal's top surface, the airflow control plate 255 may be installed to reduce turbulence, and/or to prevent objects from falling into the gap.

Like the airflow control plate 255, the facilities connection locator 203 may be any size and shape, and may occupy all or any portion of the outline of the support apparatus' outline. Both the airflow control plate 255 and facilities connection locator 203 may also be mounted to extend beyond the outline of the support apparatus' frame. Such a facilities connection locator 203 would still provide accurate positioning of facilities lines with respect to the top surface 217 of the equipment support apparatus 201, and such an airflow control plate 255 would still provide airflow management and safety functions.

Figure 19:
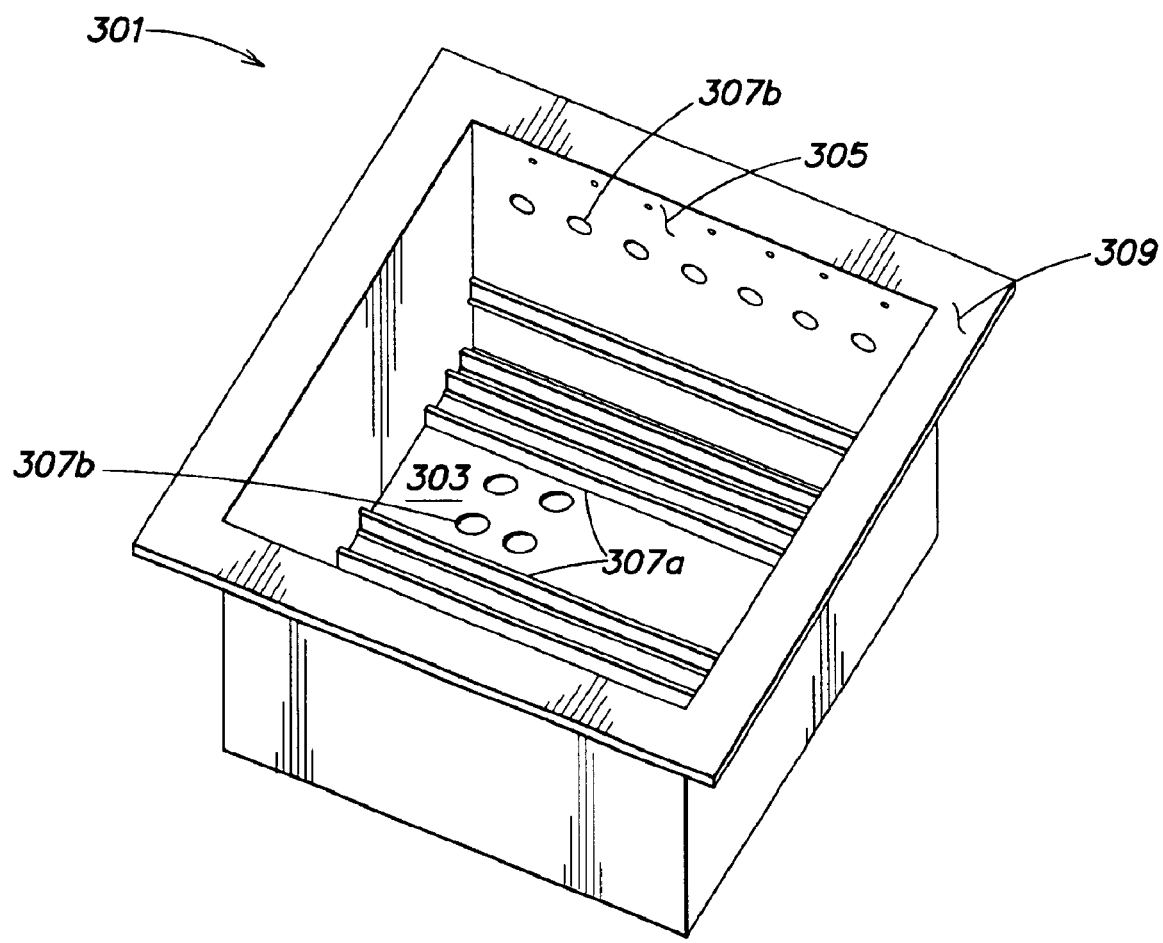
FIG. 19 is a top isometric view of an exemplary standardized facilities box.

FIG. 19 is a top isometric view of an exemplary standardized facilities box 301. The exemplary standardized facilities box 301 comprises a bottom surface 303 and a plurality of side walls 305. The standardized facilities box 301 of FIG. 19 therefore provides inherent drop containment and may prevent servicing tools or other components dropped while working in the standardized facilities box 301 from falling to the subfloor. Accordingly, use of the standardized facilities box 301 may increase safety for those working in the subfloor region.

The standardized facilities box 301 comprises mechanisms that allow one or more add-on features to be selectively coupled (i.e., attached at predetermined locations without machining). Such mechanisms may be, for example, conventional mechanisms such as tongues or grooves for coupling to a corresponding tongue or groove of an add-on feature, snap couplings, threaded couplings, predrilled bolt or screw holes, premachined slots, etc. The specific mechanism employed for selective coupling is not material. Accordingly, in FIG. 19 the coupling mechanisms are generally represented by reference number 307. When a specific one of the exemplary coupling mechanisms is described, an alphabetical reference is added to the general reference number 307.

An individual add-on feature may be selectively coupled to the standardized facilities box 301 if that specific add-on feature is needed for a particular installation. In this manner installation is both facilitated, as on site machining of the facilities box 301 is not required, and standardized, as the specific add-on features are in a known location within the standardized facilities box 301. To the extent there is more than one location within a given standardized facilities box 301 for a given add-on feature, it follows that the location for the add-on feature may be further specified. Standardization of facilities connections simplifies troubleshooting, enables use of standardized documentation such as installation, maintenance or safety information. Moreover, standardization of facilities connection locations (e.g., process gas or fluid lines, vacuum or exhaust lines) from one installation to the next, promotes greater processing uniformity. In one aspect, the specific add-on features may be positioned (e.g., moved around adjacent various coupling mechanisms, until a desired fit (for example, allowing the desired number of add on features) is achieved.

Figure 23:
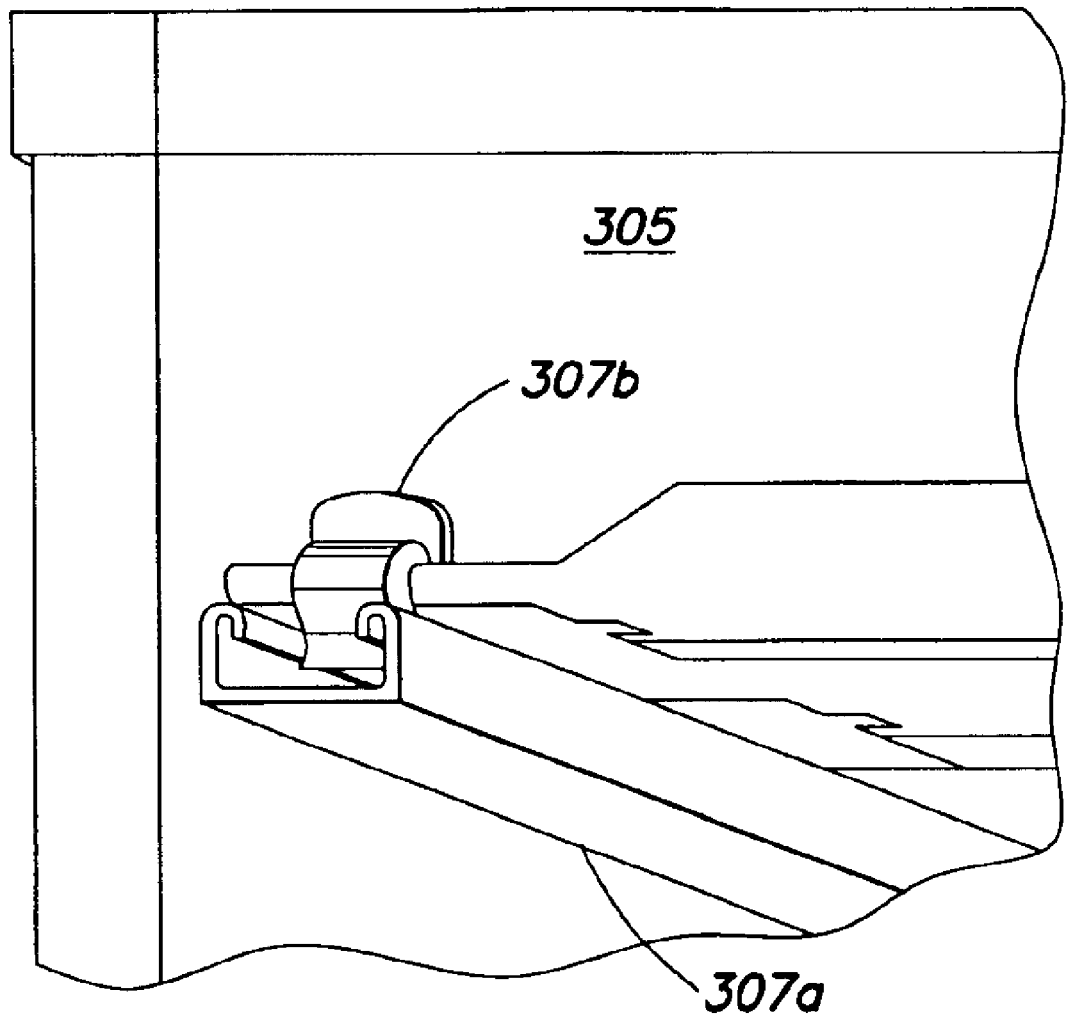
FIG. 23 is a close up perspective view, taken from the side, showing an exemplary locating mechanism coupled in a tongue and groove manner to a unistrut rail type coupling mechanism.

Coupling mechanisms 307 of an exemplary standardized facilities box 301 may include, for example, a guide (e.g., a grooved track or rail) 307a which may run along the interior and/or exterior of the bottom surface 303 and/or along the interior or exterior of the one or more side walls 305. One or more locating mechanisms 307b (such as snap couplings, bolt/screw holes, or mechanical stops, etc.) may be positioned along the guide 307a as shown on the bottom wall 305 of FIG. 19. FIG. 23 is a close up perspective view, taken from the side, showing an exemplary locating mechanism 307b (such as a tubing clamp) coupled in a tongue and groove manner to a unistrut rail type coupling mechanism 307a Alternatively, the guide 307a may be omitted, and only the locating mechanisms 307b (bolt holes, or threaded holes, etc.) employed, as shown on the sidewall 305 of FIG. 19.

Other coupling mechanisms 307 may comprise one or more precut openings, or perforated knockouts (e.g., portions of the sidewalls or bottom of the facilities box that may be easily removed with manual force, such as when struck by a hammer or mallet), through which facilities connections may be made (e.g., through which a subfloor facilities line may be coupled to a processing tool located above the raised floor). The precut openings may include a removable cap 307c (FIG. 20) which may snap or screw in place, for example. The precut openings of perforated knockouts may include snap, twist or screw on mechanisms to which a riser 213 (such as that described with reference to FIG. 12) or other z-axis locating mechanism may be selectively coupled. The top of the side walls 305 may include a coupling mechanism for coupling a cover to the standardized facilities box 301 (e.g., a hinge 307e (FIG. 20)), a prefacilitated location for mounting a hinge, snap fit mechanisms or tabs).

Figure 22:
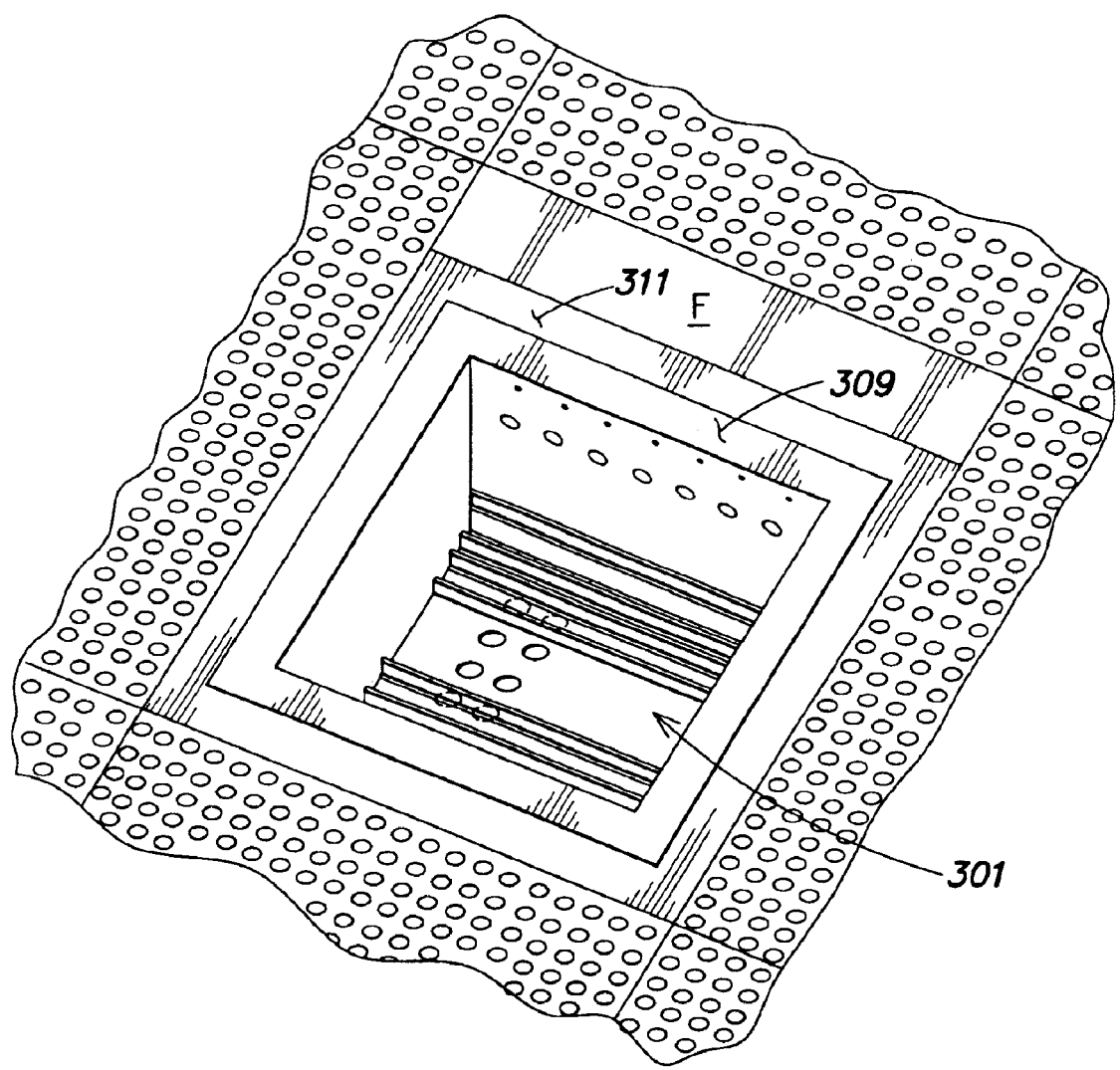
FIG. 22 is a top plan view of a standardized facilities box having a bridge flange and filler plate coupled thereto.

The exemplary standardized facilities box 301 also may comprise a flange 309 for coupling the standardized facilities box 301 to the raised floor 168 (FIG. 8), to a support pedestal 140 (FIG. 8) or to a bridge flange 311 (shown in FIG. 22). The flange 309 may include a coupling mechanism 307 for coupling the flange 309 to any one of a number of bridge flanges 311 (FIG. 22). In one aspect the flange 309 and the bridge flange 311 may couple, simply by overlapping such that the bridge flange 311 supports the flange 309. Each of the bridge flanges 311 may be adapted to couple to a floor tile, tool pedestal, etc., of differing thickness. Further each bridge flange 311 may be of varying size so as to fill open space (resulting from floor tile removal) that is not occupied by the standardized facilities box 301. Alternatively, a filler plate F (FIG. 22) may be provided to occupy such open space. Standard sizes of filler plates F may be provided for use with commonly used raised floor systems. The filler plate F may be perforated so as not to interfere with laminar air flow, and will be strong enough to support operator traffic. It will be understood that any selectively coupleable member that adapts a standardized facilities box to a floor tile grid system that employs floor tiles having a larger footprint then the footprint of the standardized facilities box (e.g., larger than the footprint of the flange 309), may be considered a bridge mechanism. In this manner, floor tile cutting may be avoided, and standardized facilities box 301 installation further facilitated.

Figure 20:
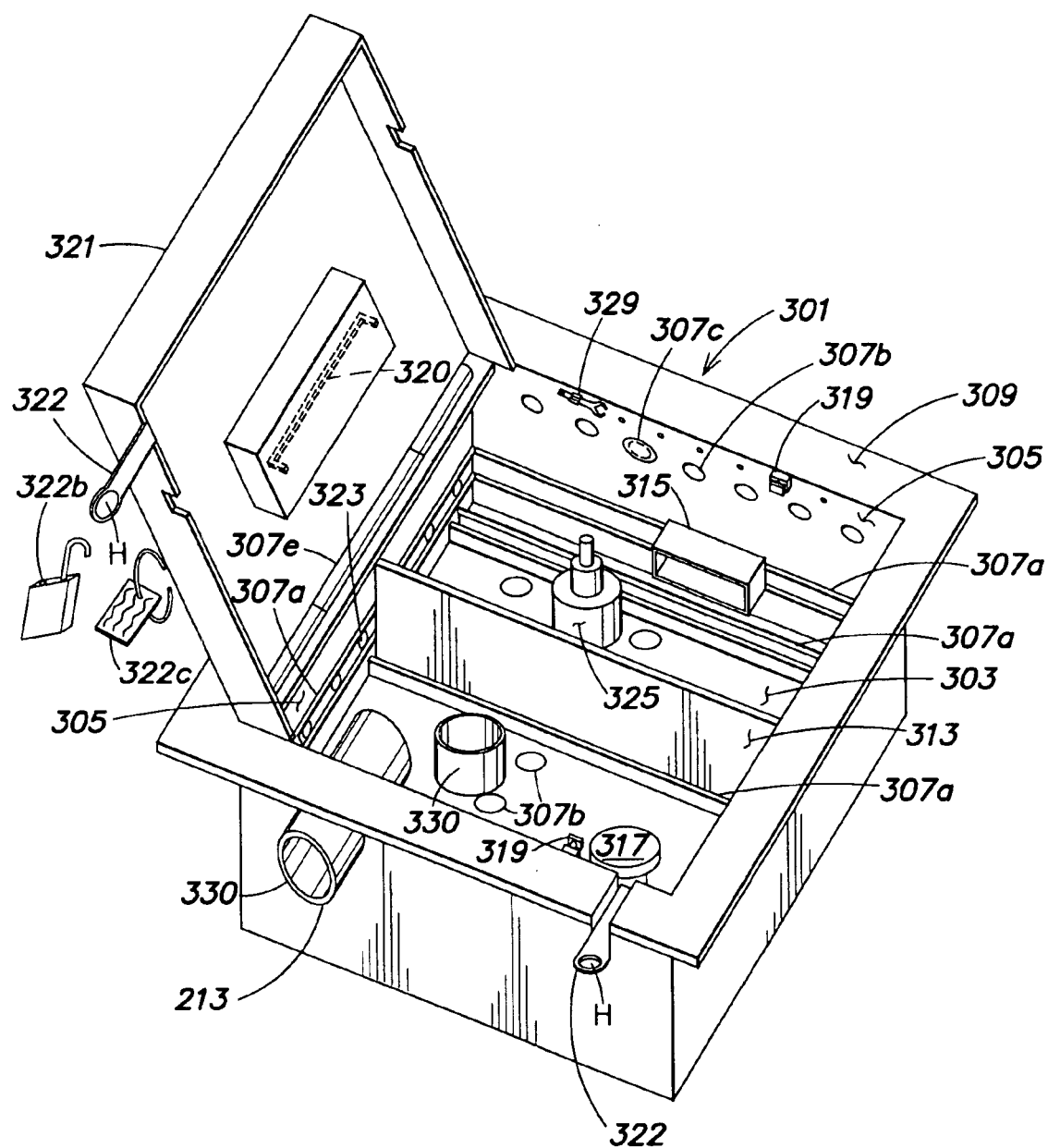
FIG. 20 shows the standardized facilities box of FIG. 19 having a plurality of add-on features coupled thereto.

FIG. 20 shows the standardized facilities box 301 of FIG. 19 having a plurality of add-on features coupled thereto. It should be emphasized that the positions of the add-on features are merely exemplary, as the standardized facilities box 301 may allow a number of predefined positions for a given add-on feature.

As shown in FIG. 20, a partition 313 is shown coupled to the guide 307a that runs along the bottom surface 303, and may function to separate incompatible facilities (e.g., fluids and electrical lines). A document storage compartment 315 is shown coupled to the guide 307a that runs along one of the side walls 305. As with each of the add-on features, the document storage compartment 315 may be coupled to a coupling mechanism 307 at any location. A particularly advantageous location may be to locate the document storage compartment 315 on the underside of the cover 321.

A sensor 317 (e.g., a heat, fluid, or pressure sensor) is shown coupled to the locating mechanisms 307b. The sensor 317 may include a warning indicator such as a visual (e.g., a flag that ejects from a cylinder and is visible through the transparent cover 321) or audible warning indicator. A lockout mechanism 319 may operatively couple to the sensor 317 and may function for example to lock a cover 321 (shown hingedly coupled to the standardized facilities box 301) when a given condition (fire, leak, etc.) is detected by the sensor 317 or is detected elsewhere in the semiconductor fabrication facility. Also, any individual facilities connection line within the facilities box 301 may be locked and tagged, as is conventionally known.

Every connection within the box may be locked and tagged out simultaneously via a lock out tag out mechanism 322 fixed to the cover 321 and adapted to allow the cover to be locked and tagged. Conventionally, tagging out means to attach an indicator that identifies for example, which operator has locked the device. Typically the indicators are in the form of a tag, thus the term "tag out" is conventionally employed. Such a mechanism may comprise for example, a pair of sidewardly extending tabs, one that extends from the cover 321, and one that extends from the side of the standardized facilities box 301. Each tab may have a hole H formed therethrough. The two holes H may be adapted such that a lock 322b (e.g., padlock or combination lock, etc.) and tag 322c can be inserted therethrough, thus locking the cover 321 to the facilities box 301.

Alternatively, the box may include an internal cover (not shown) that need not be adapted to support the weight of personnel or equipment. The internal cover may include a tab that extends upwardly and has a hole that aligns with a hole on a tab internal to the facilities box, thus allowing the internal cover to be locked to the facilities box. Thereafter, the cover 321, may be closed over the internal cover, if desired. As will be apparent, a lockout mechanism may take a number of different forms, and may be located at a number of different positions. Accordingly, the lock out mechanism shown and described herein is merely exemplary.

The cover 321 may have a recessed and/or retractable handle 320 (FIG. 20) to facilitate lifting. Provided the cover 321 is transparent, a floor lighting strip 323 may be coupled to the standardized facilities box 301 via one of the guides 307a that extend along a side wall 305 of the standardized facilities box 301. The floor lighting strip 323 may be coupled to the sensor 317, and may be adapted to illuminate when a leak, or other malfunction is detected by the sensor 317. Alternatively the floor lighting strip 323 may be coupled to a central monitor, and may be illuminated as floor lighting in the event the lights in the FAB are inoperable. Similarly a lifting mechanism 325 (see FIG. 20) such as a pneumatic lift may be coupled to the standardized facilities box 301 for example via locating mechanisms 307b located on bottom surface 303 of the standardized facilities box 301, and may be adapted to lift/lower items to or from the standardized facilities box 301. Such items may include the cover 321.

In the example of FIG. 20, a pair of tool mounting mechanisms 329 such as snap connectors are shown mounting a service tool (e.g., a wrench). In other embodiments a tool storage mechanism such as an enclosure may be mounted within the standardized facilities box 301. An exhaust mechanism 330 may be coupled (e.g., to a knockout panel 247 (FIG. 12) located on the bottom 303 or the side/front wall 305) and may be adapted to maintain the internal region of the facilities box 301 at a negative pressure (e.g., coupled to a pump), so as to prevent gas leaks from escaping the box 301. Facilities connections are preferably made in the region internal to the facilities box 301, such that leaks (gas, fluid, etc.) may be contained therein.

Figure 21:
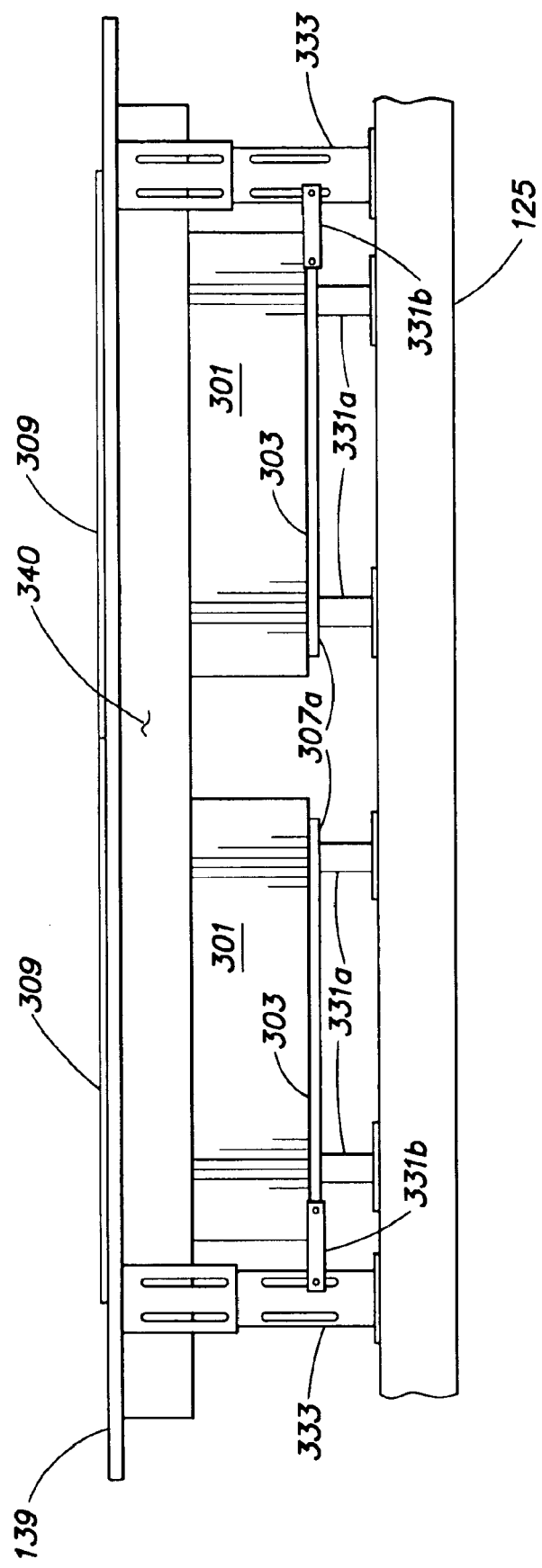
FIG. 21 is a side elevational view showing a pair of the standardized facilities boxes of FIG. 19 coupled together.

FIG. 21 is a side elevational view showing a pair of the standardized facilities boxes 301 of FIG. 19 coupled together or merely placed side by side. In this embodiment the standardized facilities boxes 301 may be coupled via coupling mechanisms (such as a joiner plate (not shown), or an interlocking coupling (not shown)) located on their respective flanges 309. Such interlocking couplings would preferably join in an over/under relationship, so as to maintain planarity with the surrounding floor. Alternatively the standardized facilities boxes 301 may be coupled via coupling mechanisms 307 that are positioned along the sidewalls 305 of the respective standardized facilities boxes 301 or via a bridge flange 311.

Also shown in FIG. 21 are support legs 331a–b, coupled to the standardized facilities boxes 301 via the guide 307a that extends along the exterior of the bottom surface 303. The first support leg 331a is shown extending to the waffle grid subfloor 125 (FIG. 6), and the second support leg 331b is shown cantilevered to a support leg 333 which may be a support leg of the raised floor grid 139 or of a support pedestal 140 for a fabrication tool 111. It will be understood that the support legs 331a–b are optional. Any number of support legs may be employed, and either cantilevered or direct floor coupling supports legs may be employed exclusively. Although, for clarity, the flanges 309 of the standardized facilities boxes 301 are shown resting on top of the raised floor 139, in a preferred aspect, the flanges 309 of the standardized facilities boxes 301 will be flush with the raised floor or equipment support pedestal to which they are mounted. Note that reference number 340 represents a floor beam of a raised floor, or a beam of an equipment support pedestal.

Installation of one or more new tools for semiconductor device fabrication may be easier and more repeatable from one installation to the next, with use of the inventive system which provides standardized locations for facilities connections, and/or prefacilitated locations for inclusion of add-on features. An exemplary method for using the inventive system to achieve standardization may include indicating a location within a fabrication facility for installing a facilities box; providing a standardized facilities box; providing a plurality of add-on features and specifying which add-on feature should be selectively coupled to which selective coupling mechanism of the standardized facilities box.

Although the inventive system of standardized facilities boxes and add-on features is most advantageous for locating and standardizing facilities connections to a processing tool, in other aspects, the standardized facilities box may be used for locating joints in a length of a fluid, gas or electrical line which may extend along a factory for producing semiconductor devices (i.e., a FAB). By locating such joints with a facilities box, areas where maintenance or further connections are most likely to be needed are easy to identify and access. Further, inherent drop and/or leak containment may be provided by the standardized facilities box. The facilities boxes may be fluid tight and/or may be maintained at a negative pressure via coupling to a facilities exhaust line.

In other aspects the facilities location box may merely provide a convenient location for containing needed tools, documents, safety indicators, floor lights, etc. Accordingly, in a further aspect, the invention comprises a FAB that employs facilities boxes in such a manner. Another aspect comprises a method for standardized FAB construction, that provides specific locations for standardized facilities boxes, and specific ad-on features to be included therein. Finally, it should be understood that many of the add-on features may themselves be inventive when used within a facilities box. Accordingly, the invention may comprise a facilities box with such features, whether or not the add-on feature is fixedly or selectively coupled to the box. Examples may include a facilities box that comprises a support leg of its own, thus allowing the facilities box to be coupled directly to a raised floor (as shown in FIG. 21), rather than to an equipment pedestal. Further examples may include a facilities box that comprises lift/lowering mechanisms, and/or a facilities box that includes sensors, an exhaust mechanism, or a lockout mechanism (i.e., a mechanism adapted to automatically lock a cover of the facilities box when a specific condition is sensed).

Figure 24:
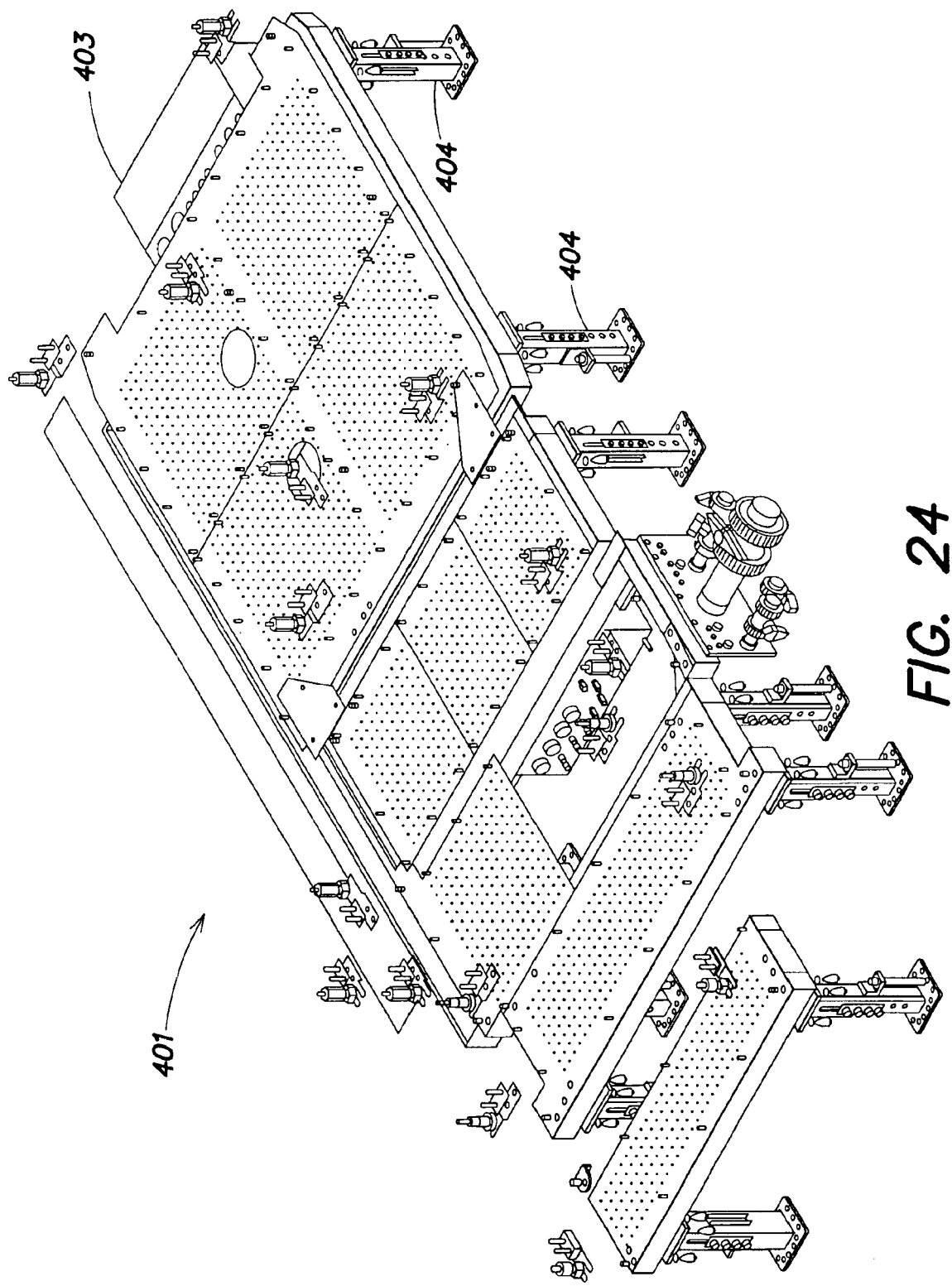
FIG. 24 is an isometric view, taken from above, of a semiconductor manufacturing equipment support pedestal with which a facilities connection box provided in accordance with the invention is installed.
Figure 25:
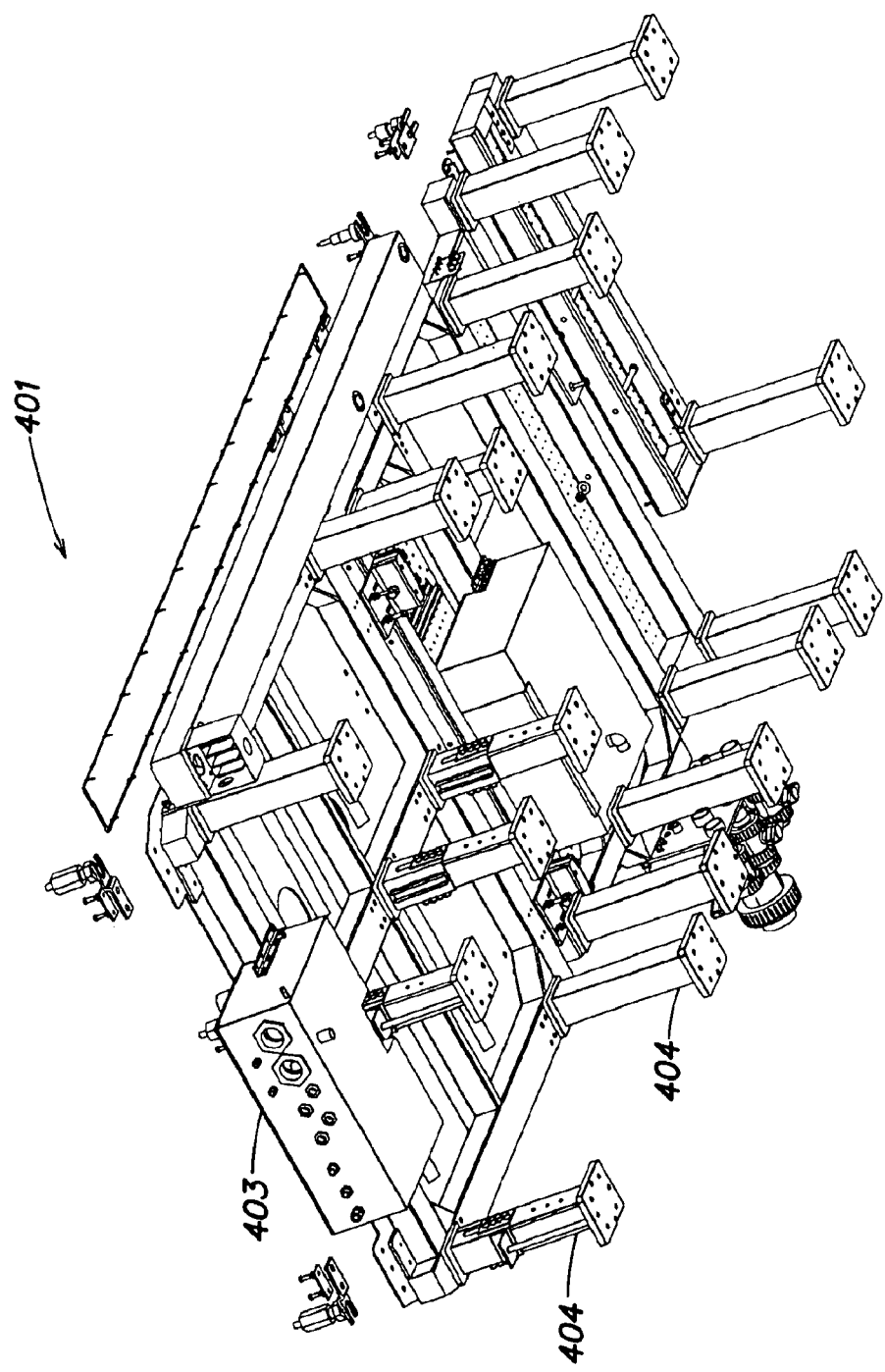
FIG. 25 is an isometric view, taken from below, of the semiconductor manufacturing equipment support pedestal of FIG. 24, with the inventive facilities connection box installed therewith.

FIG. 24 is an isometric view, taken from above, of a semiconductor manufacturing equipment support pedestal 401, to which a facilities connection box 403, provided in accordance with an aspect of the invention, is installed. FIG. 25 is an isometric view taken from below of the support pedestal 401 and the facilities connection box 403. The support pedestal 401 may be such as to support semiconductor manufacturing equipment of the type referred to as a "polisher", which is a type of equipment that is well known in the art. A polisher may require one or more slurries or other potentially hazardous materials that should be brought to the polisher within suitable double-containment lines to reduce the possibility of a leak of such materials out into the fabrication facility. The inventive facilities connection box 403 is adapted to accommodate double-containment facility lines and provides a convenient, standardized point of junction for both double-containment lines and non-double-containment lines adjacent the place of installation of the semiconductor manufacturing equipment. (Although not so indicated in the drawings, support legs 404 of the support pedestal 403 may be formed of cylindrical sections in accordance with teachings of commonly assigned co-pending U.S. patent application Ser. No. 10/214,878, filed Aug. 8, 2002, entitled "Adjustable Support Leg for Semiconductor Device Manufacturing Equipment Support Pedestal", which is incorporated herein in its entirety by reference.)

Figure 26:
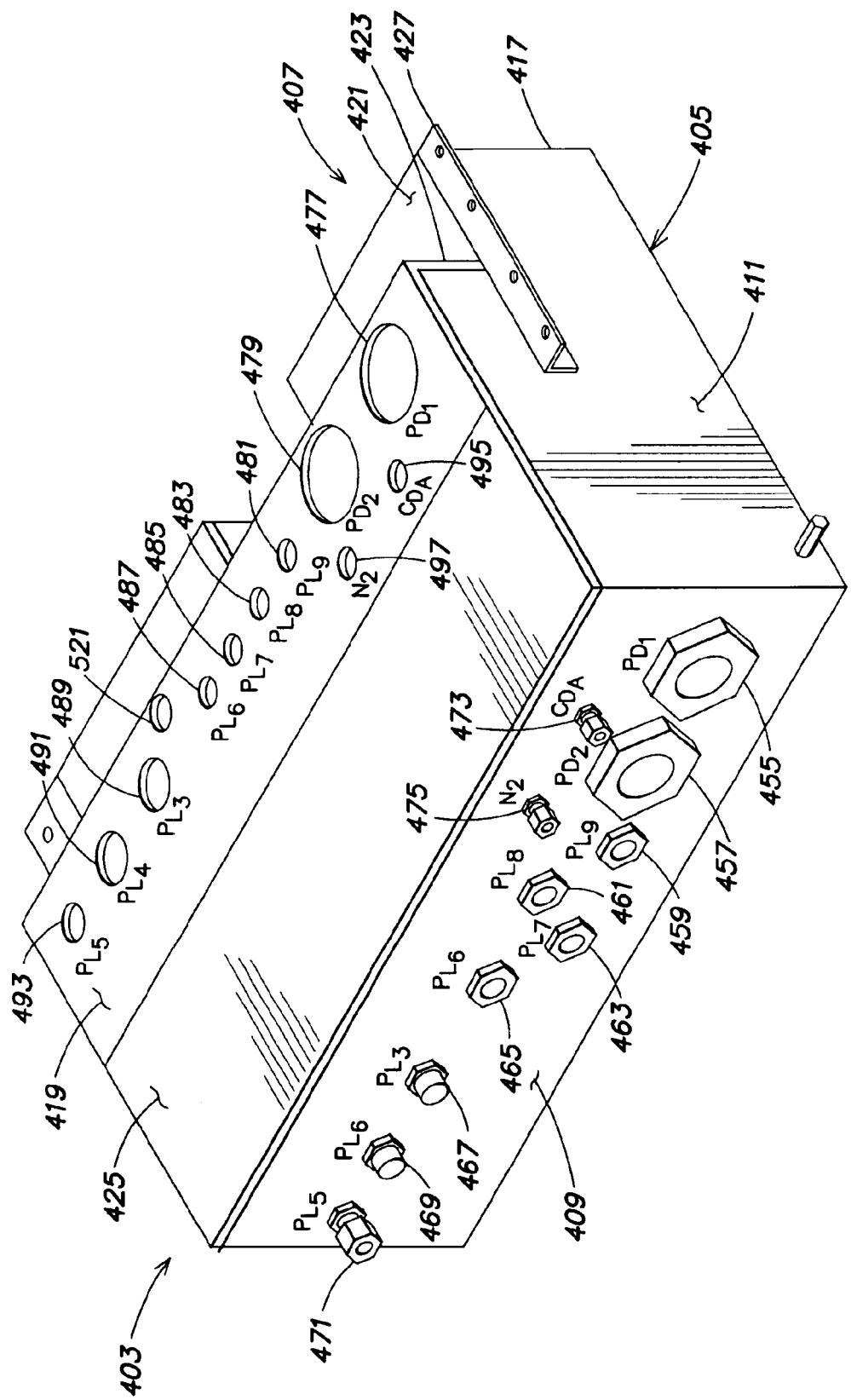
FIG. 26 is an isometric view of the inventive facilities connection box shown in FIGS. 24 and 25.
Figure 27:
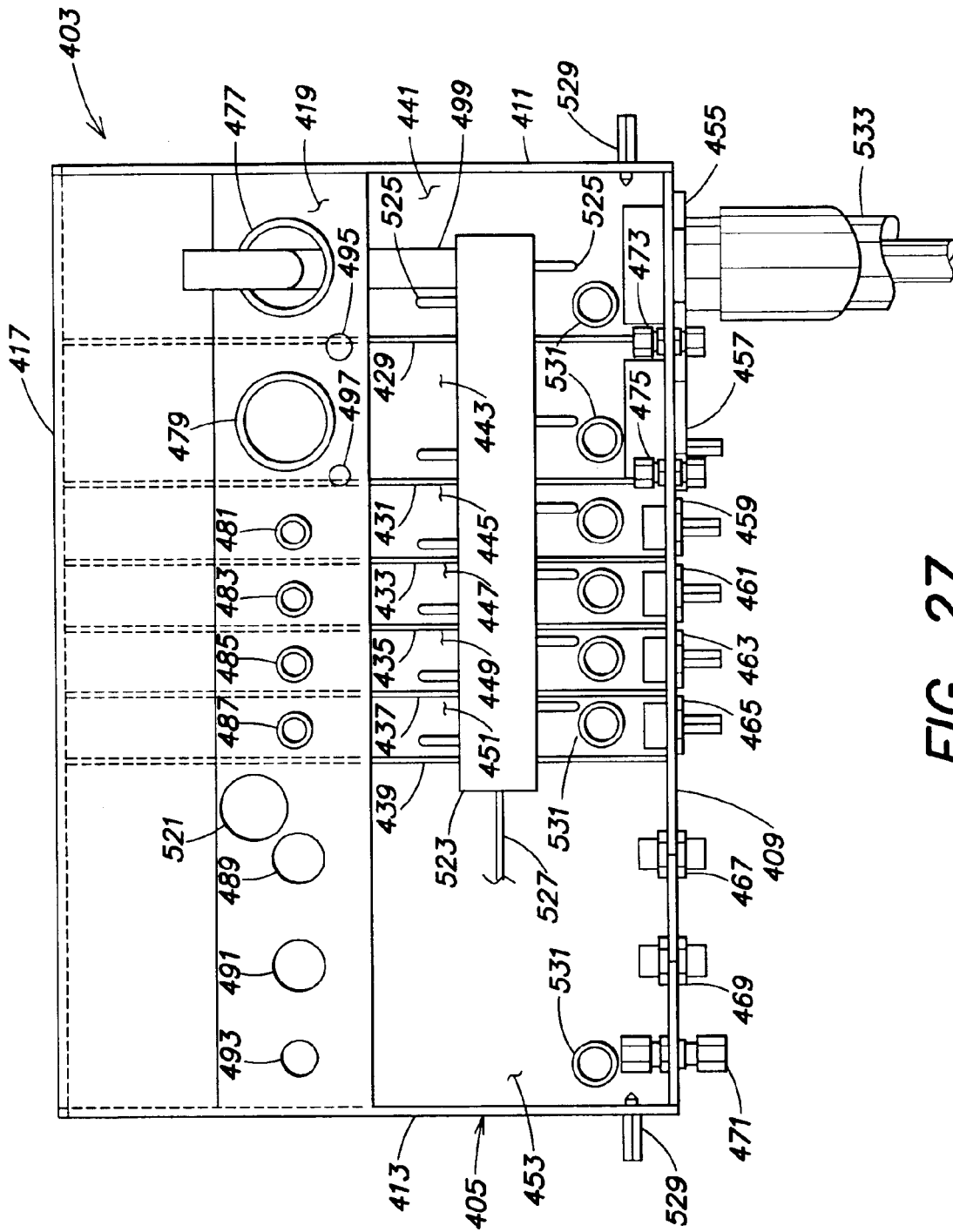
FIG. 27 is a top plan view of the inventive facilities connection box.
Figure 28:
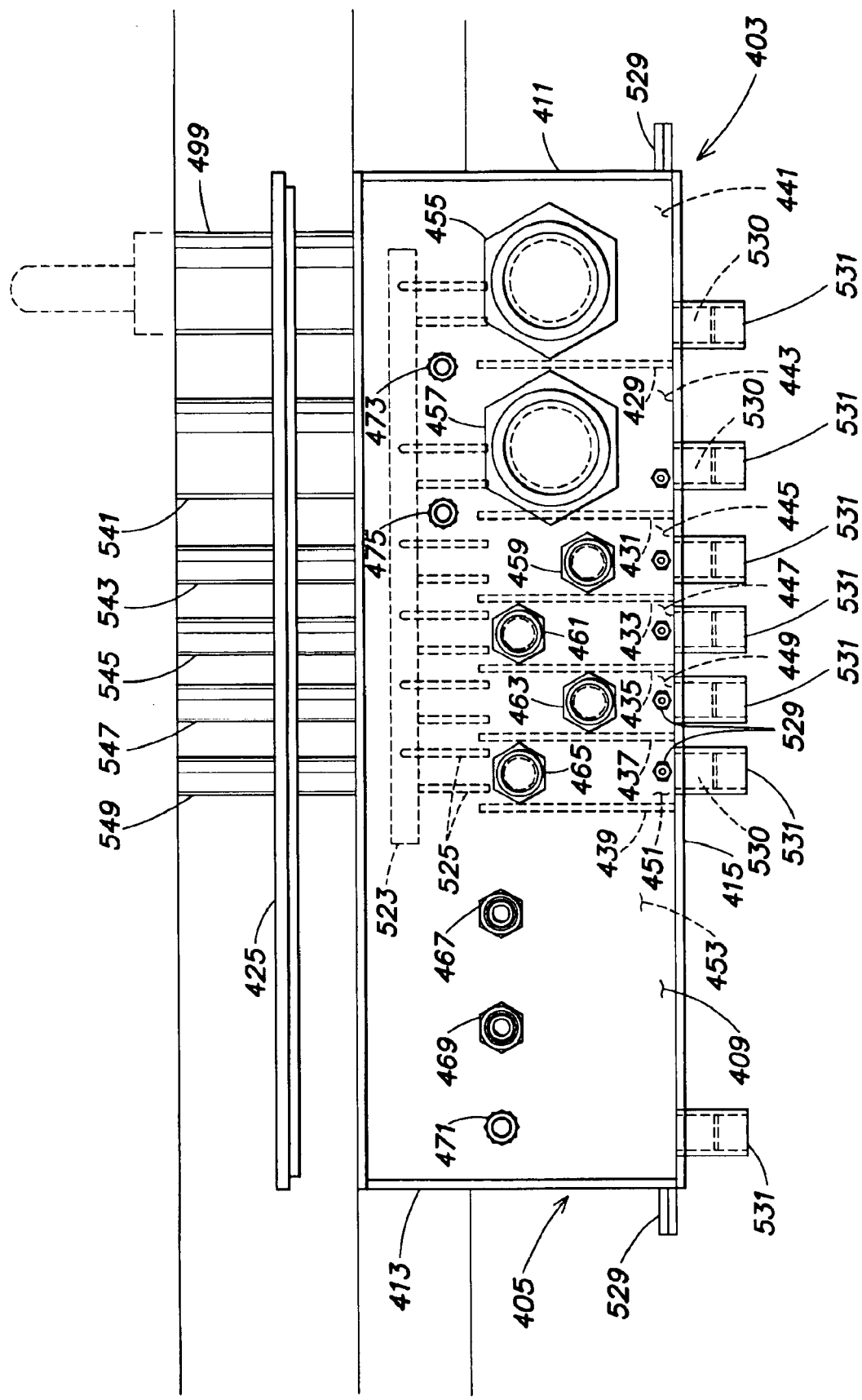
FIG. 28 is a front elevational view of the inventive facilities connection box.
Figure 29:
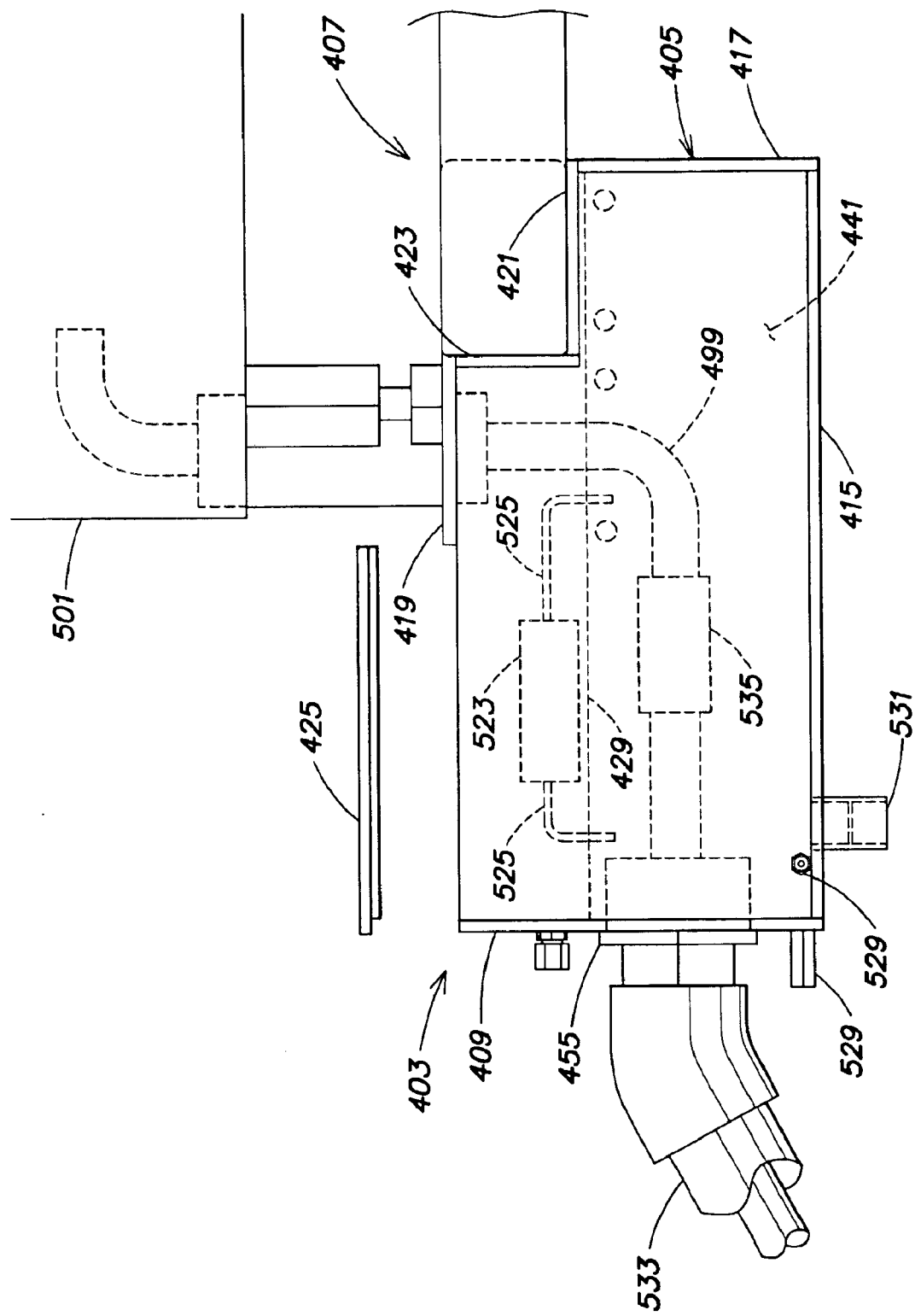
FIG. 29 is a side elevational view of the inventive facilities connection box.

Details of the facilities connection box 403 will now be described with reference to FIGS. 26–29. FIG. 26 is an isometric view of the inventive facilities connection box 403. FIG. 27 is a top view of the inventive facilities connection box 403, shown with the cover removed. FIG. 28 is a front elevational view of the inventive facilities connection box 403. FIG. 29 is a side elevational view of the inventive facilities connection box 403.

The inventive facilities connection box 403 includes an enclosure 405. In the particular embodiment illustrated in FIGS. 26–29, the enclosure 405 is generally rectangular, with a step at the rear 407 of the enclosure 405. Note the step may be omitted. In the embodiment shown the step down region is included because the rear portion of the exemplary facilities connection box 403 is intended to fit beneath the frame of the equipment pedestal, and the front portion is intended to be flush with the FAB floor.

The enclosure 405 is made up of a front wall 409, side walls 411, 413, a bottom wall 415, a rear wall 417, a top plate 419, an intermediate top wall 421 and an intermediate rear wall 423. A removable cover 425 (shown above the remainder of the inventive facilities connection box 403) selectively closes the top portion of the enclosure 405 adjacent the top plate 419. The top plate 419 and the cover 425 (when in place) may be considered to constitute a top wall of the enclosure 405. The cover 425 may include a leak-proof seal, which is not separately shown. A suitable arrangement (not shown) may be associated with the cover 425 to selectively vent vapors from the enclosure 405 to a vapor recovery handler (not shown). Mounting brackets 427 (FIG. 26, only one bracket being visible in the drawing) are provided, for example, on the side walls 411, 413 to aid in mounting the facilities connection box 403 on the support pedestal 401.

Isolation partitions 429, 431, 433, 435, 437 and 439 are disposed within the enclosure 405. The isolation partitions, for example, may be oriented parallel to the side walls 411, 413 of the enclosure 405 and positioned at intervals along the front wall 409. The isolation partitions serve to define isolation compartments 441, 443, 445, 447, 449 and 451 within the enclosure 405. The isolation partitions extend the length of the enclosure 405, (e.g., from the front wall 409 to the rear wall 417) and are joined in a liquid-tight manner to the bottom wall 415, and, in this example, the front wall 409 and the rear wall 417. As best seen in FIG. 28, the isolation partitions all have substantially the same height, which is less than the height of the front wall 409 and the side walls 411, 413. Consequently, the isolation compartments are open in an upward direction below the cover 425.

It will be observed that in this example, the front walls of the isolation compartments are constituted by the front wall 409 of the enclosure 405. The isolation partition 429 defines a boundary between the isolation compartments 441 and 443. The isolation compartment 441 is also bounded by the side wall 411 of the enclosure 405. The isolation partition 431 defines a boundary between the isolation compartments 443 and 445; the isolation partition 433 defines a boundary between the isolation compartments 445 and 447; the isolation partition 435 defines a boundary between the isolation compartments 447 and 449; and the isolation partition 437 defines a boundary between the isolation compartments 449 and 451. The isolation partition 439 defines a boundary between the isolation compartment 451 and a compartment 453. Although isolated from the isolation compartment 451, the compartment 453 may be shared, as will be seen, by a plurality of incoming facilities lines for which isolation from each other is not desired. In this example, the isolation partitions are spaced along the front wall 409 such that the isolation compartments 441, 443 are relatively large, to accommodate relatively large-diameter double-containment facilities lines, whereas the isolation compartments 445, 447, 449 and 451 are relatively small to accommodate smaller-diameter double-containment facilities lines. The top plate 419 may be considered to form a portion of a top wall of the isolation compartments 441, 443, 445, 447, 449, 451 and of the shared compartment 453.

In this example, entry ports 455, 457, 459, 461, 463, 465, 467, 469, 471, 473 and 475 are provided on the front wall 409 of the enclosure 405. As shown, the entry port 455 is adapted to couple to a relatively large-diameter double-containment facility line, and is formed in the front wall of the isolation compartment 441. The entry port 457 is also adapted to couple to a relatively large-diameter double-containment facility line and is formed in the front wall of the isolation compartment 443. The entry ports 459, 461, 463 and 465 are all adapted to couple to respective small-diameter double-containment facility lines and are respectively formed in the front walls of the isolation compartments 445, 447, 449 and 451. Thus the entry ports 455, 457, 459, 461, 463 and 465 are respectively associated with, and provide access to, the isolation compartments 441, 443, 445, 447, 449 and 451.

The entry ports 467, 469 and 471 are provided on the front wall 409 of the enclosure 405 at the locus of the shared compartment 453, and are respectively adapted to couple to facility lines that are not double-containment lines, and for which no isolation is desired.

Exit ports 477, 479, 481, 483, 485, 487, 489, 491, 493, 495 and 497 are formed in the top plate 419 of the enclosure 405. The exit ports 477, 479, 481, 483, 485, 487, 489, 491, 493, 495 and 497 are respectively associated with the entry ports 455, 457, 459, 461, 463, 465, 467, 469, 471, 473 and 475. In particular, the exit port 477 is positioned to accommodate a line 499 (FIGS. 27, 29), which exits from the isolation compartment 441 bound for the semiconductor processing equipment (e.g., a polisher) 501 (FIG. 29). Note that the top plate 419 limits unwanted access (e.g. by dropped objects, etc.) to the facilities box 403, and limits airflow into/out of the facilities box 403. Although less desirable, the top plate 419 may be omitted.

Similarly, referring to FIG. 27, the exit port 479 is positioned and adapted to accommodate a fluid line (not shown) which exits from the isolation compartment 443 bound for the semiconductor manufacturing equipment 501; the exit port 481 is positioned and adapted to accommodate a fluid line (not shown) which exits from the isolation compartment 445 bound for the semiconductor manufacturing equipment 501; the exit port 483 is positioned and adapted to accommodate a fluid line (not shown) which exits from the isolation compartment 447 bound for the semiconductor manufacturing equipment 501; the exit port 485 is positioned and adapted to accommodate a fluid line (not shown) which exits from the isolation compartment 449 bound for the semiconductor manufacturing equipment 501; and the exit port 487 is positioned and adapted to accommodate a fluid line (not shown) which exits from the isolation compartment 451 bound for the semiconductor manufacturing equipment 501.

The exit ports 489, 491 and 493 are positioned and adapted to accommodate fluid lines (not shown) which exit from the shared compartment 453.

An exhaust port 521 is also formed in the top plate 419 of the enclosure 405. The exhaust port 521 is adapted to be connected to an exhaust line (not shown) which vents or exhausts the enclosure 405.

In the space above the isolation compartments 441, 443, 445, 447, 449 and 451, and above the isolation partitions 429, 431, 433, 435, 437 and 439, a spray mechanism 523 extends transversely relative to the isolation partitions. Spray nozzles 525 may extend (e.g., downwardly) from the spray mechanism 523 into the isolation compartments. The specific configuration of the spray mechanism may vary, for example, in another aspect the spray mechanism may comprise a bar having a plurality of openings through which fluid may flow. A fluid supply line 527 (FIG. 27) couples the spray mechanism 523 to a fluid source which is not shown.

Upon occurrence of a chemical leak in one or more of the isolation compartments, a fluid (e.g., water or another neutralizing fluid) may be sprayed into the isolation compartments via the spray mechanism 523 and the spray nozzles 525 to neutralize the leaking chemical and/or to rinse the isolation compartments.

A respective liquid detection sensor 529 (FIG. 28) is provided at or near the bottom of each of the isolation compartments 441, 443, 445, 447, 449, 451 and the shared compartment 453 to detect fluid leaks therein. Each of the isolation compartments 441, 443, 445, 447, 449 and 451 and the shared compartment 453 is provided with a respective drain 531. A respective manually and/or electronically controlled drain valve 530 is associated with each of the drains 531. As shown, the drains 531 are preferably located along a wall of the enclosure 405 other than the bottom wall 415 so as to reduce the possibility of fluid leaks there from. However, in other embodiments, the drains 531 may be positioned along the bottom wall 415 with proper sealing.

FIGS. 27 and 29 show a double-containment facility line 533, suitable for carrying a hazardous material, coupled to the entry port 455 associated with the isolation compartment 441. Although not shown in the drawings, it will be understood that other facilities lines may be connected to each of the other entry ports 457, 459, 461, 463, 465, 467, 469, 471, 473 and 475. In one embodiment, by way of example, the facility line 533 may be a drain line for draining hazardous materials and other materials from the semiconductor manufacturing equipment 501, and the lines 457 and 455 may be drain lines for waste deionized water and used polisher slurry, respectively.

Each of the entry ports 459, 461, 463 and 465 (respectively associated with isolation compartments 445, 447, 449, 451) may be connected to a respective double-containment slurry supply line (not shown). The entry ports 467 and 469 may be connected to cooling lines (not shown) and the entry port 471 may be connected to a deionized water supply line (not shown). The entry ports 473 and 475 may be connected to gas supply lines (not shown) for which isolation is not required.

Referring to FIG. 29, a coupling connector 535 is installed within the isolation compartment 441 to couple the double-containment facility line 533, which enters the isolation compartment 441 via the entry port 455, with the exiting line 499, which is bound for the semiconductor device manufacturing equipment 501 via the exit port 477 (FIG. 27). Thus a flow path is provided from the entry port 455 to the exit 477. (As noted above, the facility line 533 may be a drain line, such that the actual flow of material may be in the direction from the exit port 477 to the entry port 455.)

Although not shown in the drawings, a similar arrangement of a coupling connector and a flow path between an entry port and an exit port may be provided in each of the other isolation compartments.

Figure 30:
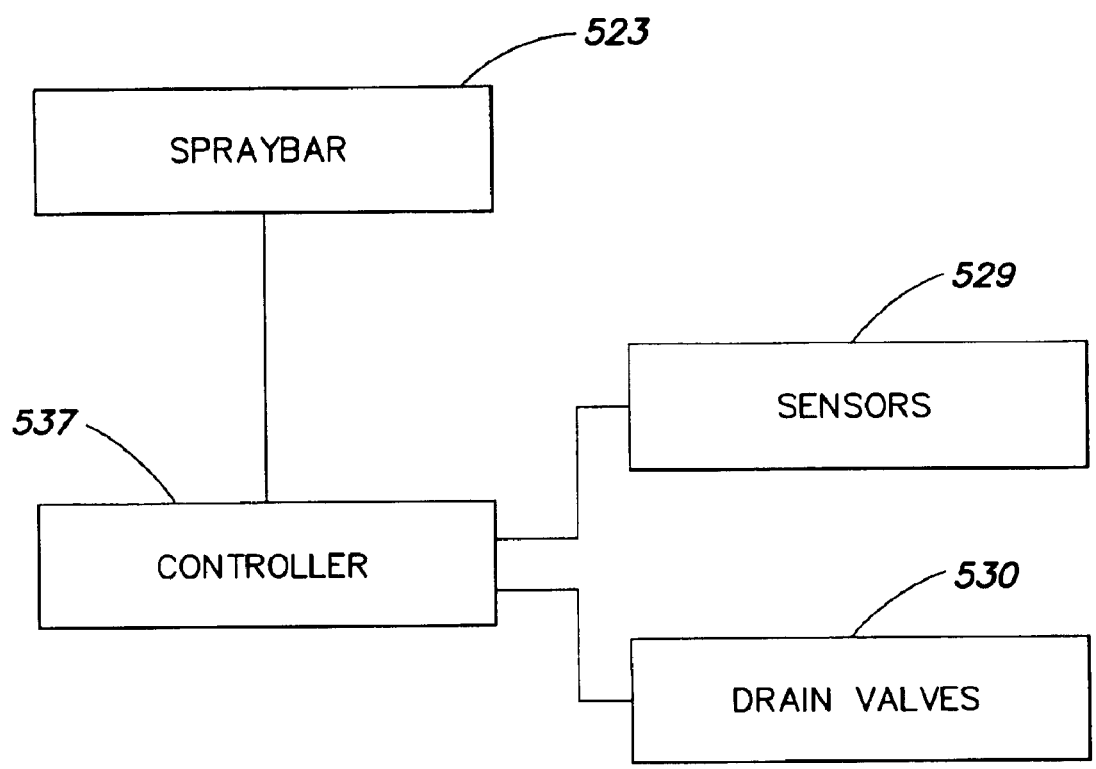
FIG. 30 is a schematic block diagram showing a controller coupled to certain components of the inventive facilities connection box.

As schematically illustrated in FIG. 30, a controller 537 is coupled to the liquid detection sensors 529 to receive leak detection signals from the sensors 529 (FIGS. 29 and 30). The controller 537 is also coupled to the spray mechanism 523 (and/or to the above-mentioned liquid supply (not shown) associated with the spray mechanism 523) to selectively spray rinsing and/or neutralizing fluid into the isolation compartments. The controller 537 is also coupled to drain valves 530, to selectively open the drain valves 530 so as to drain the isolation compartments 441, 443, 445, 447, 449, 451 and the shared compartment 453 when required. The controller 537 shown in FIG. 30 may be a control device dedicated to controlling the facilities connection box 403 or alternatively may control other equipment as well. For example, the controller 537 may also control other facilities connection boxes (not shown) or may be a controller which controls the semiconductor manufacturing equipment 501 and/or which controls part or all of the semiconductor fabrication facility.

Referring again to FIG. 28, fluid lines 541, 543, 545, 547, 549 are shown exiting isolation compartments 443, 445, 447, 449, 451 respectively, bound for the semiconductor manufacturing equipment 501 (FIG. 29).

The facilities connection box provided in accordance with the present invention accommodates pre-plumbing of facilities lines required for semiconductor manufacturing equipment, thereby promoting convenient installation of the semiconductor manufacturing equipment. The inventive facilities connection box is suitable for use with double-containment facilities that may carry hazardous materials. In addition, the inventive facilities connection box is arranged to isolate and control leakage of hazardous material which may occur at a junction between the facilities lines and lines terminating at the semiconductor manufacturing equipment. Other features and advantages the inventive facilities box may provide are as follows:

provides an easily accessible prefacilities connection point to speed the installation of wafer processing equipment (for example, the Applied Materials CMP Reflexion and Mira Mesa systems);

provides an easily accessible, safe, double containment enclosure to connect plumbing lines for hazardous chemical, liquid based material;

provides segregation of hazardous chemical, liquid based materials if a fluid line or connection should develop a leak;

provides a method of early leak detection in order to prevent major clean up of hazardous chemical contamination;

provides a safe method to neutralize hazardous chemical contamination due to leaks or spillage;

provides a controllable method to rinse clean and drain neutralized chemical contamination from all or one segregated area(s) of the container;

can be easily constructed of materials (e.g., PVC, Teflon, stainless steel, etc.) that are compatible with the hazardous liquid chemicals that are used within the system;

the container may be completely leak proof and may be vented to extract hazardous vapors caused by leaks and spillage; and may have both manual and automatic capability to detect, signal a leak (e.g., activate a visual or audible alarm), neutralize, rinse, drain and/or vent so as to purge the enclosure of hazardous materials.

The foregoing description discloses only an exemplary embodiment of the invention; modifications of the above disclosed apparatus which fall within the scope of the invention will be readily apparent to those of ordinary skill in the art. For example, the inventive facilities connection box may include more or fewer isolation compartments, compartments adapted to accommodate relatively wide-diameter double-containment lines. Isolation compartments adapted to accommodate relatively small-diameter double-containment lines, and/or non-double-containment lines than the exemplary connection box illustrated herein.

It should also be understood that not every installation of an inventive facilities connection box may have facilities lines connected to every entry port of the facilities connection box.

The facilities connection box of the present invention has been shown as installed with a particular type of semiconductor manufacturing equipment support pedestal. It will be understood, however, that the inventive connection box can be installed with other types of support pedestals, as well as with equipment that does not require a support pedestal.

Although the isolation partitions are each shown as single walls, one or more of the isolation partitions may be formed as a double wall, or more generally as two or more walls with a space or spaces there between.

Also, any opening (in any wall including the less preferred bottom wall) that allows a fluid line to exit from an isolation compartment bound for the semiconductor manufacturing equipment may be considered an exit port.

Moreover, as will be appreciated from previous discussion, when the inventive facilities connection box is installed and in use, fluid may flow in either direction through a given isolation compartment, i.e., either from the entry port to the exit port or from the exit port to the entry port.

The inventive facilities connection box disclosed herein is illustrated in a particular configuration suitable for use with a polisher, but other configurations, and use with other types of semiconductor device manufacturing equipment, would fall within the scope of the invention.

Accordingly, while the present invention has been disclosed in connection with exemplary embodiments thereof, it should be understood that other embodiments may fall within the spirit and scope of the invention, as defined by the following claims.

The invention claimed is:

1. A facilities connection box adapted to couple double-containment lines to semiconductor device manufacturing equipment, comprising:
   an enclosure;
   a first isolation compartment defined inside the enclosure;
   a second isolation compartment defined inside the enclosure;
   an isolation partition which defines a boundary between the first and second isolation compartments;
   a first entry port associated with the first isolation compartment and adapted to couple to a first incoming double-containment fluid line;
   a first exit port associated with the first isolation compartment and adapted to permit egress of a first outgoing fluid line from the first isolation compartment;
   a second entry port associated with the second isolation compartment and adapted to couple to a second incoming double-containment fluid line; and
   a second exit port associated with the second isolation compartment and adapted to permit egress of a second outgoing fluid line from the second isolation compartment, to the semiconductor device manufacturing equipment;
   wherein:
      the first isolation compartment is adapted to accommodate a fluid flow path between the first entry port and the first exit port; and
      the second isolation compartment is adapted to accommodate a fluid flow path between the second entry port and the second exit port.

2. The facilities connection box of claim 1, wherein the first entry port is formed in a front wall of the first isolation compartment and the second entry port is formed in a front wall of the second isolation compartment.

3. The facilities connection box of claim 2, wherein the front walls of the first and second isolation compartments are formed by a front wall of the enclosure.

4. The facilities connection box of claim 1, wherein the first exit port is formed in a top wall of the first isolation compartment and the second exit port is formed in a top wall of the second isolation compartment.

5. The facilities connection box of claim 1, wherein the first and second exit ports are formed in a top plate of the enclosure.

6. The facilities connection box of claim 5, wherein the isolation partition is below and does not contact the top plate of the enclosure.

7. The facilities connection box of claim 6, further comprising a spray mechanism that extends laterally above the isolation partition.

8. The facilities connection box of claim 7, wherein the spray mechanism is adapted to spray fluid into both of the first and second isolation compartments.

9. The facilities connection box of claim 1, further comprising:
   a first drain formed in a bottom wall of the first isolation compartment; and
   a second drain formed in a bottom wall of the second isolation compartment.

10. The facilities connection box of claim 1, further comprising:
    a first liquid detection sensor positioned to detect liquid in the first isolation compartment; and a second liquid detection sensor positioned to detect liquid in a second isolation compartment.

11. The facilities connection box of claim 1, further comprising:
    a first liquid detection sensor positioned to detect liquid in the first isolation compartment;
    a second liquid detection sensor positioned to detect liquid in the second isolation compartment;
    a first drain formed in a bottom wall of the first isolation compartment;
    a first drain valve coupled to the first drain;
    a second drain formed in a bottom wall of the second isolation compartment;
    a second drain valve coupled to the second drain;
    a spray mechanism adapted to spray a fluid into both of the first and second isolation compartments; and
    a controller coupled to the first and second liquid detection sensors, the first and second drain valves and the spray mechanism and adapted to:
       receive detection signals from the first and second liquid detection sensors;
       selectively open the first and second drain valves; and
       selectively actuate the spray mechanism to spray fluid into the first and second isolation compartments.

12. The facilities connection box of claim 1, further comprising a spray mechanism that extends laterally above the isolation partition.

13. The facilities connection box of claim 12, wherein the spray mechanism is adapted to spray a fluid into both of the first and second isolation compartments.

14. The facilities connection box of claim 1, further comprising:
    a first flow path provided within the first isolation compartment and including a coupling connector that couples a line that enters the first isolation compartment via the first entry port with a line that exits the first isolation compartment via the first exit port; and
    a second flow path provided within the second isolation compartment and including a coupling connector that couples a line that enters the second isolation compartment via the second entry port with a line that exits the second isolation compartment via the second exit port.

15. The facilities connection box of claim 2, wherein the first exit port is formed in a top wall of the first isolation compartment and the second exit port is formed in a top wall of the second isolation compartment.

16. The facilities connection box of claim 2, wherein the first and second exit ports are formed in a top plate of the enclosure.

17. The facilities connection box of claim 1 further comprising an exhaust mechanism coupled to a pump and adapted to remove exhaust from the enclosure.

18. A facilities connection box adapted to couple double-containment lines to a semiconductor device manufacturing tool, comprising:
   an enclosure;
   a plurality of isolation compartments contained within the enclosure, each isolation compartment being divided from an adjacent isolation compartment by an isolation partition, each isolation compartment having associated therewith a respective entry port adapted to couple to a respective incoming double-containment fluid line and a respective exit port adapted to permit egress of a respective outgoing fluid line from the respective isolation compartment.

19. The facilities connection box of claim 18, wherein the isolation compartments are arranged in a row parallel to a front wall of the enclosure.

20. The facilities connection box of claim 19, further comprising a spray mechanism that extends parallel to the front wall of the enclosure and is adapted to spray a fluid into each of the isolation compartments.

21. The facilities connection box of claim 20, further comprising a plurality of drains, each formed in a bottom wall of a respective one of the isolation compartments.

22. The facilities connection box of claim 21, further comprising a plurality of liquid detection sensors, each positioned to detect liquid in a respective one of the isolation compartments.

23. The facilities connection box of claim 18, further comprising a second plurality of entry ports that are not isolated from each other.

24. The facilities connection box of claim 22, further comprising:
   a plurality of drain valves, each coupled to a respective one of the drains; and
   a controller coupled to the liquid detection sensors, the drain valves and the spray mechanism and adapted to:
      receive detection signals from the liquid detection sensors;
      selectively open the drain valves; and
      selectively actuate the spray mechanism to spray fluid into the isolation compartments.

25. The facilities connection box of claim 18 further comprising an exhaust mechanism coupled to a pump and adapted to remove exhaust from the enclosure.

* * * * *